(12) United States Patent
Izumi et al.

(10) Patent No.: US 9,978,616 B2
(45) Date of Patent: May 22, 2018

(54) PRESSING APPARATUS, SUBSTRATE BONDING APPARATUS AND STACKED SUBSTRATE

(71) Applicant: NIKON CORPORATION, Tokyo (JP)

(72) Inventors: Shigeto Izumi, Yokohama (JP); Satoshi Takahashi, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 740 days.

(21) Appl. No.: 14/297,891

(22) Filed: Jun. 6, 2014

(65) Prior Publication Data

US 2014/0349118 A1 Nov. 27, 2014

Related U.S. Application Data

(63) Continuation of application No. PCT/JP2012/007859, filed on Dec. 7, 2012.

(30) Foreign Application Priority Data

Dec. 8, 2011 (JP) ................................. 2011-269404
Dec. 8, 2011 (JP) ................................. 2011-269406

(51) Int. Cl.
*B32B 37/00* (2006.01)
*H01L 21/67* (2006.01)
(Continued)

(52) U.S. Cl.
CPC ........ *H01L 21/67092* (2013.01); *B30B 15/06* (2013.01); *B30B 15/064* (2013.01);
(Continued)

(58) Field of Classification Search
CPC ......... H01L 21/67092; H01L 21/67126; H01L 21/673; B30B 30/06; B30B 15/064; B30B 7/0046; B30B 37/10
(Continued)

(56) References Cited

U.S. PATENT DOCUMENTS 4,511,425 A * 4/1985 Boyd ...................... B65C 9/188
100/211
5,300,170 A * 4/1994 Donohoe .................. B44C 1/16
100/207
(Continued)

FOREIGN PATENT DOCUMENTS

JP 2005-302856 10/2005
JP 2009-542012 11/2009
(Continued)

OTHER PUBLICATIONS

International Search Report and Written Opinion of the International Searching Authority issued by the Japanese Patent Office in corresponding International Application No. PCT/JP2012/007859, dated Jan. 15, 2013 (14 pages).
(Continued)

*Primary Examiner* — James Sells
(74) *Attorney, Agent, or Firm* — Finnegan, Henderson, Farabow, Garrett & Dunner, LLP

(57) ABSTRACT

Moving the substrates quickly, as well as applying a large pressure to the substrates are required. A pressing apparatus for pressing a plurality of substrates stacked on one another, includes: a first stage that supports the plurality of substrates; a second stage that can sandwich the plurality of substrates between the first stage and the second stage; a driving section that moves the first stage towards the second stage so as to sandwich the plurality of substrates; and a pressing section that, when the driving section has made the first stage reach a predetermined position, applies a pressing force to the first stage to press the plurality of substrates between the first stage and the second stage, where the driving section and the pressing section are arranged next to each other so that at least part of the driving section and the pressing section overlaps in the moving direction.

29 Claims, 21 Drawing Sheets

(51) Int. Cl.
    *B32B 37/10*     (2006.01)
    *H01L 21/673*     (2006.01)
    *B30B 15/06*     (2006.01)
    *B32B 37/18*     (2006.01)
    *B32B 38/18*     (2006.01)

(52) U.S. Cl.
    CPC .......... *B32B 37/0046* (2013.01); *B32B 37/10* (2013.01); *H01L 21/673* (2013.01); *H01L 21/67126* (2013.01); *B32B 37/18* (2013.01); *B32B 38/1841* (2013.01); *B32B 2038/1891* (2013.01); *B32B 2309/12* (2013.01); *B32B 2309/14* (2013.01); *B32B 2309/68* (2013.01); *B32B 2457/14* (2013.01); *Y10T 428/31504* (2015.04)

(58) Field of Classification Search
    USPC ...................................... 156/580, 581, 583.1
    See application file for complete search history.

(56) References Cited

U.S. PATENT DOCUMENTS

| | | | |
|---|---|---|---|
| 7,948,034 | B2 | 5/2011 | George et al. |
| 2014/0262045 | A1 | 9/2014 | Tanaka et al. |

FOREIGN PATENT DOCUMENTS

| | | |
|---|---|---|
| JP | 2010-21242 | 1/2010 |
| JP | 2010-027726 | 2/2010 |
| JP | 2010-153513 | 7/2010 |
| JP | 2011-071331 | 4/2011 |
| TW | 201135802 A1 | 10/2011 |
| WO | WO 2009/084536 A1 | 7/2009 |
| WO | WO 2009/119096 A1 | 10/2009 |

OTHER PUBLICATIONS

Notification of Trasmittal of Translation of the International Preliminary Report on Pantentability and International Preliminary Report on Patentability issued by The International Bureau of WIPO in corresponding International Application No. PCT/JP2012/007859, dated Jun. 19, 2014 (2 pages.).

Notice of Reasons for Rejection issued by the Japanese Patent Office in Japanese Patent Application No. 2014-507392 dated Feb. 7, 2017, and English translation thereof.

Office Action issued by Taiwan Intellectual Property Office in counterpart Taiwanese Application No. 101146308 dated Aug. 1, 2016, and English translation thereof.

Office Action issued by the Japanese Patent Office dated Sep. 27, 2016 in counterpart Japanese Application No. 2013-548100, and English translation thereof.

\* cited by examiner

PRESSING APPARATUS, SUBSTRATE BONDING APPARATUS AND STACKED SUBSTRATE

BACKGROUND

1. Technical Field

The present invention relates to a pressing apparatus, a substrate bonding apparatus, and a stacked substrate.

2. Related Art

Pressing apparatuses moving a substrate of a semiconductor apparatus up and down or applying pressure thereto have been known (e.g., please refer to Patent Document No. 1.).

Patent Document 1: Japanese Patent Application Publication No. 2005-302858

Occasionally, there are cases in which a pair of substrates or the like are moved up and down to be applied pressure. In such cases, it is required to move the substrates quickly, as well as to apply a large pressure to the substrates.

SUMMARY

According to an aspect of the technical innovations included herein, provided are a pressing apparatus, a substrate bonding apparatus, and a stacked substrate that can solve the aforementioned problems. According to a first aspect related to the innovations herein, provided is a pressing apparatus for pressing a plurality of substrates stacked on one another, includes: a first stage that supports the plurality of substrates; a second stage that can sandwich the plurality of substrates between the first stage and the second stage; a driving section that moves the first stage towards the second stage so as to sandwich the plurality of substrates; and a pressing section that, when the driving section has made the first stage reach a predetermined position, applies a pressing force to the first stage to press the plurality of substrates between the first stage and the second stage, where the driving section and the pressing section are arranged next to each other so that at least part of the driving section and at least part of the pressing section overlap in the moving direction.

According to a second aspect related to the innovations herein, provided is a pressing apparatus for pressing a plurality of substrates stacked on one another, including: a first stage that supports the plurality of substrates; a second stage that can sandwich the plurality of substrates between the first stage and the second stage; a driving section that moves the first stage towards the second stage so as to sandwich the plurality of substrates; a pressing section that, when the driving section has made the first stage reach a predetermined position, applies a pressing force to the first stage to press the plurality of substrates between the first stage and the second stage; and a control section that controls driving of the driving section, where the control section controls a pressing force on the first stage from the driving section, so that a pressure distribution of at least one of the first stage and the second stage is a predetermined distribution at the time of pressing by the pressing section.

According to a third aspect related to the innovations herein, provided is a pressing apparatus for pressing a plurality of substrates stacked on one another, including: a movable section that includes a first stage supporting the plurality of substrates; a second stage that can sandwich the plurality of substrates between the first stage and the second stage; a driving section that moves the first stage towards the second stage so as to sandwich the plurality of substrates; a pressing section that, when the driving section has made the first stage reach a predetermined position, applies a pressing force to the first stage to press the plurality of substrates between the first stage and the second stage; and a pressing member linked to the first stage and pressing the first stage by a pressing force received from the driving section, where the pressing member presses the center of mass of the movable section.

According to a fourth aspect related to the innovations herein, provided is a stacked substrate bonded by being pressed, while being supported by a stage, by a first pressing member linked to the stage and moved back and forth by a first cylinder; and a second pressing member linked to the stage and moved back and forth by being pressed by a second cylinder provided to enclose an outer periphery of the first cylinder, with an area different from an area of the first pressing member pressed by the first cylinder.

According to a fifth aspect related to the innovations herein, provided is a substrate bonding apparatus including: an aligning section that aligns positions of the plurality of substrates to one another; and the pressing apparatus as set forth above for pressing with one another the plurality of substrates whose positions have been aligned.

According to a sixth aspect related to the innovations herein, provided is a pressing apparatus including: a fixed section; a movable section capable of being moved back and forth with respect to the fixed section, a space to which a fluid flows in and out being formed between the movable section and the fixed section; and a tilt restraining section that restrains a tilt of the movable section due to entry of the fluid.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
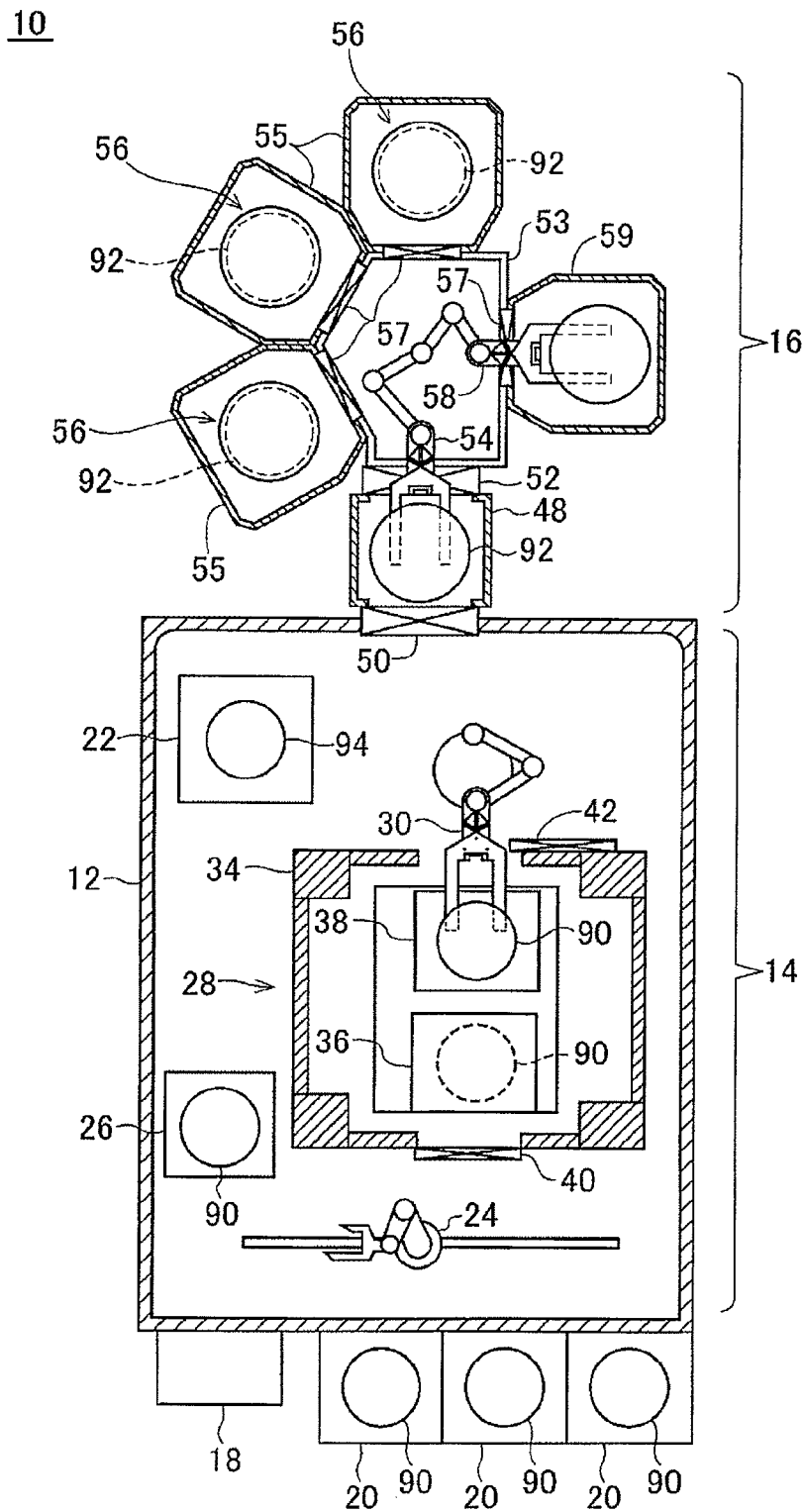
FIG. 1 shows an entire configuration of a substrate bonding apparatus 10.

FIG. 1 shows an entire configuration of a substrate bonding apparatus. The substrate bonding apparatus 10 manufactures a stacked substrate 92 by bonding two substrates 90, 90. Note that the substrate bonding apparatus 90 may be configured to manufacture a stacked substrate 92 by bonding three or more substrates 90.

As shown in FIG. 1, the substrate bonding apparatus 10 includes an atmosphere environment section 14, a vacuum environment section 16, and a control section 18.

The atmosphere environment section 14 includes an environment chamber 12, a plurality of substrate cassettes 20, 20, 20, a substrate holder rack 22, a robot arm 24, a pre-aligner 26, a provisional bonding section 28, and a robot arm 30. The environment chamber 12 is formed to enclose the atmosphere environment 14.

The substrate cassettes 20, 20, 20 contain therein a substrate 90 to be coupled and bonded in the substrate bonding apparatus 10. The substrate cassettes 20, 20, 20 also contain therein a stacked substrate 92 coupled and bonded in the substrate bonding apparatus 10. The substrate cassettes 20, 20, 20 are mounted removably to the outer surface of the environment chamber 12. This allows a plurality of substrates 90 to be collectively loaded to the substrate bonding apparatus 10, as well as allows a plurality of sets of stacked substrates 92 to be collected collectively. The substrate bonded by the substrate bonding apparatus 10 may be a single silicon wafer, compound semiconductor wafer, or glass substrate. In addition, elements, circuits, terminals or the like may be formed on the single silicon wafer, compound semiconductor wafer, or glass substrate. In addition, the loaded substrate 90 may be a stacked substrate 92 in which a plurality of wafers are stacked.

The substrate holder rack 22 contains therein a substrate holder 94 that holds a stacked substrate 92 resulting from stacking a pair of substrates 90 from above and below. The substrate holder 94 holds two substrates 90 of each set of stacked substrate by means of electrostatic adsorption.

The robot arm 24 is provided inside the environment chamber 12 and that in the vicinity of the substrate cassettes 20, 20, 20.

The robot arm 24 conveys the substrates 90 loaded in the substrate cassettes 20, 20, 20 to the pre-aligner 26. The robot arm 24 conveys the substrates 90 in the pre-aligner 26 to a substrate holder 94 mounted on a moving stage 38 of the provisional bonding section 28 described later. The robot arm 24 conveys the stacked substrate 92 coupled and conveyed to the moving stage 38, to one of the substrate cassettes 20, 20, 20.

The pre-aligner 26 is provided inside the environment chamber 12 and that in the vicinity of the robot arm 24. In loading the substrate 90 to the provisional bonding section 28, the pre-aligner 26 aligns the position of each substrate 90 so that the substrate 90 can be loaded to an adjusted range in the provisional bonding section 28 which is narrow due to its high accuracy. Accordingly, the substrate 90's position can be aligned quickly and accurately in the provisional bonding section 28.

The provisional bonding section 28 is an example of aligning section. The provisional bonding section 28 is provided between the robot arm 24 and the robot arm 30. The provisional bonding section 28 includes a frame 34, a fixed stage 36, a moving stage 38, a pair of shutter 40 and shutter 42.

The frame 34 is formed to enclose the fixed stage 36 and the moving stage 38. The surface of the frame 34 towards the substrate cassettes 20, 20, 20 and the surface thereof towards the vacuum environment section 16 are open so as to enable conveyance in and out of the substrate 90 and the stacked substrate 92.

The fixed stage 36 is fixed inside the frame 34 and that in the vicinity of the substrate cassettes 20, 20, 20. While holding the substrate 90, the lower surface of the fixed stage 36 vacuum adsorbs the substrate holder 94 conveyed from the moving stage 38 by the robot arm 30.

The moving stage 38 is provided inside the frame 34 and that closer to the vacuum environment section 16. The upper surface of the moving stage 38 vacuum adsorbs the substrate 90 as well as the substrate holder 94. The moving stage 38 moves in the horizontal direction and in the vertical direction inside the frame 34. Accordingly, by movement of the moving stage 38, the substrate 90 and the substrate holder 94 held by the fixed stage 36 are aligned to the substrate 90 and the substrate holder 94 held by the moving stage 38, to be provisionally bonded together. The substrate 90 and the substrate 90 may be provisionally bonded together by adhesives or plasmas.

The shutter 40 opens and closes the opening of the frame 34 closer to the substrate cassette 20. The shutter 42 opens and closes the opening of the frame 34 closer to the vacuum environment section 16. The region enclosed by the frame 34, the shutter 40, 42 is linked to an air conditioner or the like to be temperature controlled. Accordingly, the accuracy of the alignment between the substrate 90 and the substrate 90 improves.

The robot arm 30 is provided inside the environment chamber 12 and that between the vacuum environment section 16 and the provisional bonding section 28. The robot arm 30 conveys the substrate holder 94 contained in the substrate holder rack 22 to the moving stage 38. The substrate holder 94 mounted onto the moving stage 38 holds the substrate 90 conveyed from the pre-aligner 26 by the robot arm 24, by means of electrostatic adsorption. The robot arm 30 is mounted on the moving stage 38, and conveys, to the fixed stage 36, the substrate holder 94 holding the substrate 90 by reversing it. The lower surface of the fixed stage 36 vacuum adsorbs the substrate holder 94 conveyed by the robot arm 30, together with the substrate 90. The robot arm 90 vacuum adsorbs the stacked substrate 92, which includes a pair of substrates 90 aligned by the moving stage 38, and the substrate holder 94, and conveys them to the vacuum environment section 16. The robot arm 30 conveys the stacked substrate 92 coupled and bonded in the vacuum environment section 16, from the vacuum environment section 16 to the moving stage 38.

The vacuum environment section 16 is set to a high temperature and vacuum state in the bonding process of the substrate bonding apparatus 10. The vacuum environment section 16 includes a load lock chamber 48, a pair of access door 50 and gate valve 52, a robot arm 54, three containers 55, three heating and pressing apparatuses 56, a robot arm 58, and a cooling chamber 59. Note that the number of heating and pressing apparatuses 56 is not limited to three, and can be changed if necessary.

The load lock chamber 48 links the atmosphere environment section 14 to the vacuum environment section 16. The load lock chamber 48 can be set to a vacuum state and an atmospheric pressure. The sides of the load lock chamber 48 towards the atmosphere environment section 14 and the vacuum environment section 16 are open so as to enable conveyance of the stacked substrate 92 including a pair of substrates 90 held by the pair of substrate holders 94.

The access door 50 opens and closes the opening of the load lock chamber 48 that is towards the atmosphere environment section 14. The access door 50 is opened after the pressure gauge has confirmed that the pressure within the load lock chamber 48 is equal to the atmospheric pressure after air is introduced to the load lock chamber 48 through a port not illustrated in the drawing, i.e., is opened to the air. Accordingly, the load lock chamber 48 is linked to the atmosphere environment section 14. In this state, the robot arm 30 conveys the stacked substrate 92 between the load lock chamber 48 and the provisional bonding section 28.

The gate valve 52 opens and closes the opening of the load lock chamber 48 that is towards the vacuum environment section 16. The gate valve 52 is opened when the load lock chamber 48 has substantially the same pressure as the robot chamber 53 after the air is exhausted from the load lock chamber 48, i.e., vacuumed, via a port. Accordingly, the load lock chamber 48 is linked to the vacuum environment section 16. Note that in the boding process, there are no occasions in which both of the access door 50 and the gate valve 52 are opened.

The robot arm 54 is contained inside the robot chamber 53. The robot arm 54 conveys, to any of the heating and pressing apparatuses 56, the stacked substrate 92 conveyed into the load lock chamber 48 by the robot arm 30, and the gate valve 52 is closed.

The container 55 is formed to be hollow. The container 55 is linked to the robot chamber 53 via the gate valve 57. The gate valve 57 seals the container 55 returned to the atmospheric pressure during maintenance. The container 55 contains therein and encloses the main part of the heating and pressing apparatus 56. The container 55 opens and closes the gate valve 57 so as to convey in and out the stacked substrate 92. After the stacked substrate 92 has been conveyed in, the container 55 is sealed by closing the gate valve 57 so as to restrain gas generated due to the heating, from leaking to the robot chamber 53. In the heated state of the stacked substrate 92, the container 55 is set to be in the vacuum state, and is insulated from the heat due to the heating.

Three heating and pressing apparatuses 56 are arranged in the radial formation with the center being the robot arm 54, so that the robot arm 54 can reach each heating and pressing apparatus 56. The heating and pressing apparatus 56 has such a configuration as to enable heating and pressing a stacked substrate 92, so as to realize a bonding function by bonding and pressing a stacked substrate 92 including a plurality of semiconductor substrates conveyed in from the load lock chamber 48 and stacked on one another.

The robot arm 58 is provided on the center of the robot chamber 53 to be rotatable, so as to realize a function of conveying the stacked substrate 92 from the heating and pressing apparatus 56 to the cooling chamber 59 as well as a function of conveying the stacked substrate 92 from the cooling chamber 59 to the load lock chamber 48.

The cooling chamber 59 has a cooling function so as to realize a function of cooling the high-temperature stacked substrate 92 coupled by the robot arm 58. The cooling chamber 59 is configured to be able to set to a vacuum state. The cooling chamber 59 is linked to the robot chamber 53 via the gate valve 57.

The control section 18 controls the entire operation of the substrate bonding apparatus 10. The control section 18 has an operation section to be operated from outside by a user attempting to throw the power on, making each type of setting or the like of the substrate bonding apparatus 10. Furthermore, the control section 18 is connected online so as to manage the recipe, process progress of the host computer in semiconductor factories.

Figure 2:
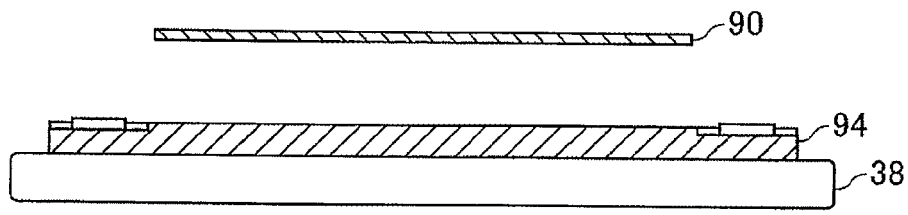
FIG. 2 explains a bonding process of a stacked substrate by a substrate bonding apparatus 10.

FIG. 2 through FIG. 7 explain a bonding process of a stacked substrate by a substrate bonding apparatus. In the bonding process, first, the robot arm 24 conveys the substrate 90 from any of the substrate cassettes 20 to the pre-aligner 26. Next, as shown in FIG. 2, the robot arm 30 conveys the substrate holder 94 from the substrate holder rack 22 to the moving stage 38. The moving stage 38 vacuum adsorbs the substrate holder 94. The robot arm 24 conveys the substrate 90 whose position has been adjusted by the pre-aligner 26 towards above the substrate holder 94 mounted on the moving stage 38.

Figure 3:
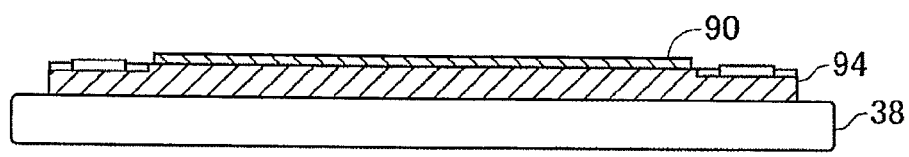
FIG. 3 explains a bonding process of a stacked substrate by a substrate bonding apparatus 10.
Figure 4:
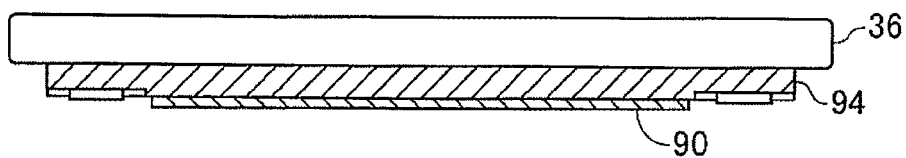
FIG. 4 explains a bonding process of a stacked substrate by a substrate bonding apparatus 10.

Next, as shown in FIG. 3, the robot arm 24 mounts the substrate 90 on the substrate holder 94. The substrate holder 94 electrostatic adsorbs the mounted substrate 90. The robot arm 30 conveys the substrate holder 94 holding the substrate 90 from the moving stage 38 to the fixed stage 36 by reversing it. As shown in FIG. 4, the fixed stage 36 holds the substrate holder 94 by vacuum adsorption after having received the substrate holder 94 together with the substrate 90.

Figure 5:
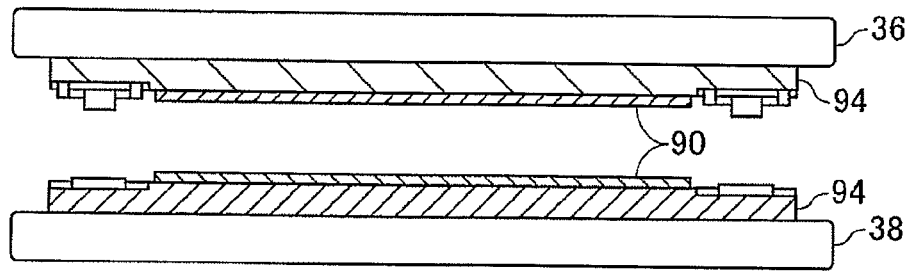
FIG. 5 explains a bonding process of a stacked substrate by a substrate bonding apparatus 10.

Next, by performing a similar operation, the robot arm 30 conveys the substrate holder 94 to the moving stage 38, and thereafter the robot arm 24 conveys the substrate 90 to the substrate holder 94 on the moving stage 38. Accordingly as shown in FIG. 5, the moving stage 38 holds the substrate 90 and the substrate holder 94 with the substrate 90 up, and the fixed stage 36 holds the substrate 90 and the substrate holder 94 with the substrate 90 down. After the shutter 40, 42 have been closed, the moving stage 38 moves below the fixed stage 36 holding the substrate 90 and the substrate holder 94, while holding the substrate 90 and the substrate holder 94. As a result, the substrate 90 of the moving stage 38 is aligned in position with the substrate 90 of the fixed stage 36.

Figure 6:
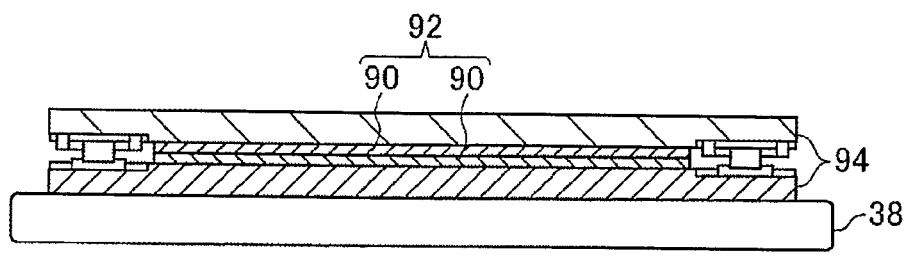
FIG. 6 explains a bonding process of a stacked substrate by a substrate bonding apparatus 10.

Next, as shown in FIG. 6, the moving stage 38 moves upward, thereby making the upper surface of the substrate 90 on the moving stage 38 contact the upper surface on the fixed stage 36. After the fixed stage 36 has released the vacuum adsorption of the substrate holder 94, the moving stage 38 moves towards the robot arm 30, while vacuum adsorbing the substrate holder 94 holding the stacked substrate 92.

Next, the access door 50 is opened, and the load lock chamber 48 is linked to the atmosphere environment section 14. Note that the gate valve 52 is in the closed state, and the vacuum state is maintained in the robot chamber 53, the container 55, ra and the cooling chamber 59. While in this state, the robot arm 30 conveys the stacked substrate 92 on the moving stage 38 to the load lock chamber 48. Thereafter, the access door 50 is closed, and the load lock chamber 48 is vacuumed, and then the gate valve 52 is opened, and the load lock chamber 48 is insulated from the atmosphere environment section 14 as well as being linked to the vacuum environment section 16. While in this state, the robot arm 54 conveys the stacked substrate 92 from the load lock chamber 48 to the heating and pressing apparatus 56, and the gate valve 52 is closed.

Next, after heating the stacked substrates 92, 92 to the coupling temperature, the heating and pressing apparatus 56 presses the stacked substrate 92 from above and below while maintaining the coupling temperature. Accordingly, the substrates 90, 90 of the stacked substrate 92 are coupled and bonded. Thereafter, the robot arm 58 conveys the bonded stacked substrate 92 to the cooling chamber 59. The cooling chamber 59 cools the stacked substrate 92.

Next, the inside of the load lock chamber 48 is vacuumed, and thereafter the gate valve 52 is opened. The robot arm 58 is conveys the cooled stacked substrate 92 from the cooling chamber 59 to the load lock chamber 48, together with the substrate holder 94.

Figure 7:
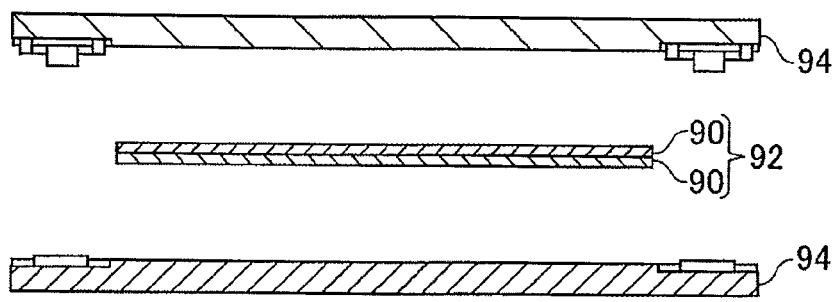
FIG. 7 explains a bonding process of a stacked substrate by a substrate bonding apparatus 10.

Next, the load lock chamber 48 is opened to the air, and then the access door 50 is opened. While in this state, the robot arm 30 conveys the stacked substrate 92 from the load lock chamber 48 to the moving stage 38. As shown in FIG. 7, on the moving stage 38, the robot arm 30 separates the stacked substrate 92 from the substrate holder 94. After this, the robot arm 24 conveys the stacked substrate 92 to one of the substrate cassettes 20, 20, 20. Accordingly, the bonding process of the stacked substrate 92 performed by the substrate bonding apparatus 10 ends, and the stacked substrate 92 completes.

Figure 8:
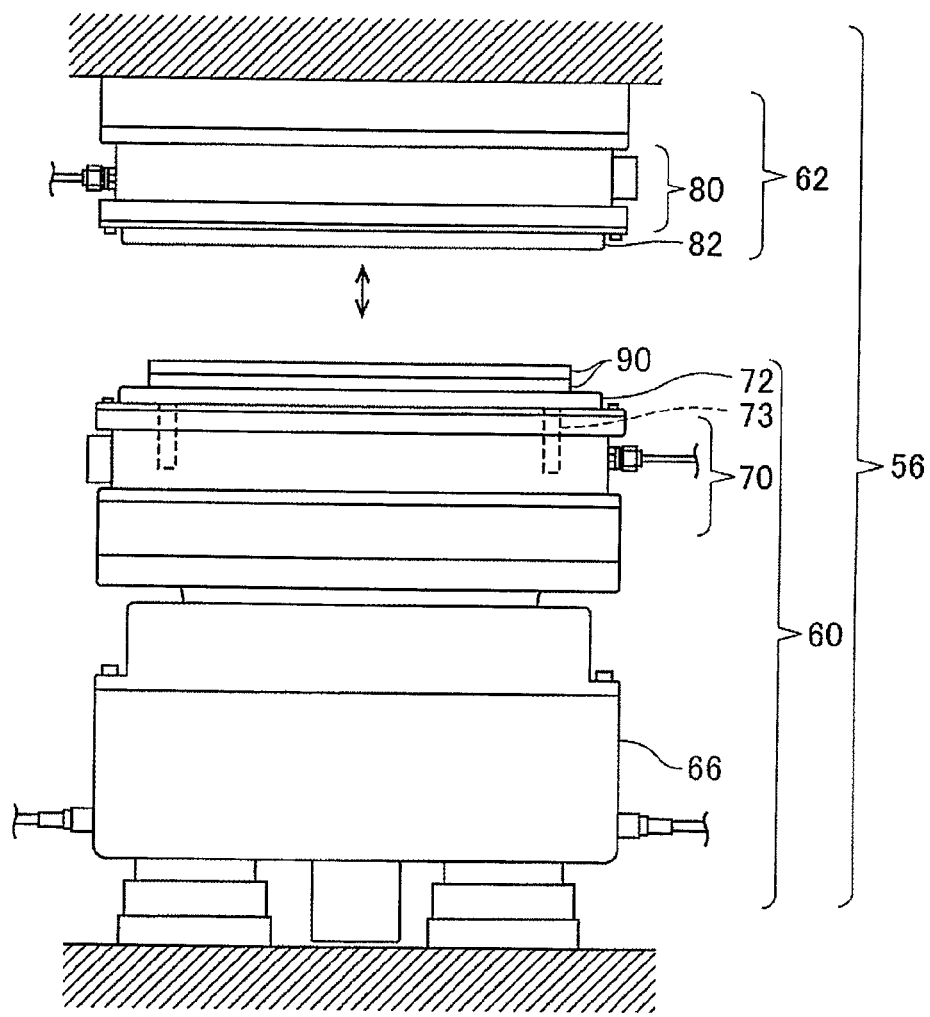
FIG. 8 is a front view of the entire structure of a heating and pressing apparatus 56.

FIG. 8 is a front view of the entire structure of a heating and pressing apparatus. As shown in FIG. 8, the heating and pressing apparatus 56 includes a lower module 60 provided for the floor and an upper module 62 provided for the ceiling.

The lower module 60 includes an elevator section 66, being an example of a movable apparatus, a lower heating module 70, a lower top plate 72, and a push-up pin 73.

The elevator section 66 moves the lower heating module 70 and the lower top plate 72 towards the later described upper top plate 82, so as to sandwich the pair of substrates 90, to be raised and lowered. In addition, after the substrate 90 has reached the lower surface of the upper module 62, which corresponds to when the lower top plate 72 has reached a predetermined position, the elevator section 66 applies pressure to the lower top plate 72, thereby pressing the pair of substrates 90 between the lower top plate 72 and the upper top plate 82.

The lower heating module 70 is provided above the elevator section 66. The lower heating module 70 is configured to be able to heat or cool a pair of substrates 90. Note that for bonding substrates 90 without heating them, the lower heating module 70 can be omitted.

The lower top plate 72 is an example of a first stage and a movable stage. The lower top plate 72 is provided on an upper surface of the lower heating module 70. The lower top plate 72 is formed as a circular plate having a diameter larger than that of the substrate 90. The upper surface of the lower top plate 72 supports the pair of stacked substrates 90. The lower top plate 72 is moved back and forth by the elevator section 66.

The push-up pin 73 is an example of a mounting section, and holds the substrate 90 by protruding above the lower top plate 72, when exchanging the substrate 90 with the robot arm 54.

The upper module 62 includes an upper heating module 80 and an upper top plate 82. The upper heating module 80 has substantially the same configuration as the lower heating module 70. The upper heating module 80 is fixed to the upper surface of the upper top plate 82. The upper heating module 80 includes a heater heating the stacked substrate 92. The upper top plate 82 is fixed to the upper portion of the container 55. The upper top plate 82 is provided in a position opposing the lower top plate 72, and presses the pair of substrate 90 by sandwiching the substrate 90 between the upper top plate 82 and the lower top plate 72. The lower surface of the upper top plate 82 heats the stacked substrate 92 by means of the heat from the upper heating module 80, as well as serving as a pressing surface to press the upper surface of the stacked substrate 92.

Figure 9:
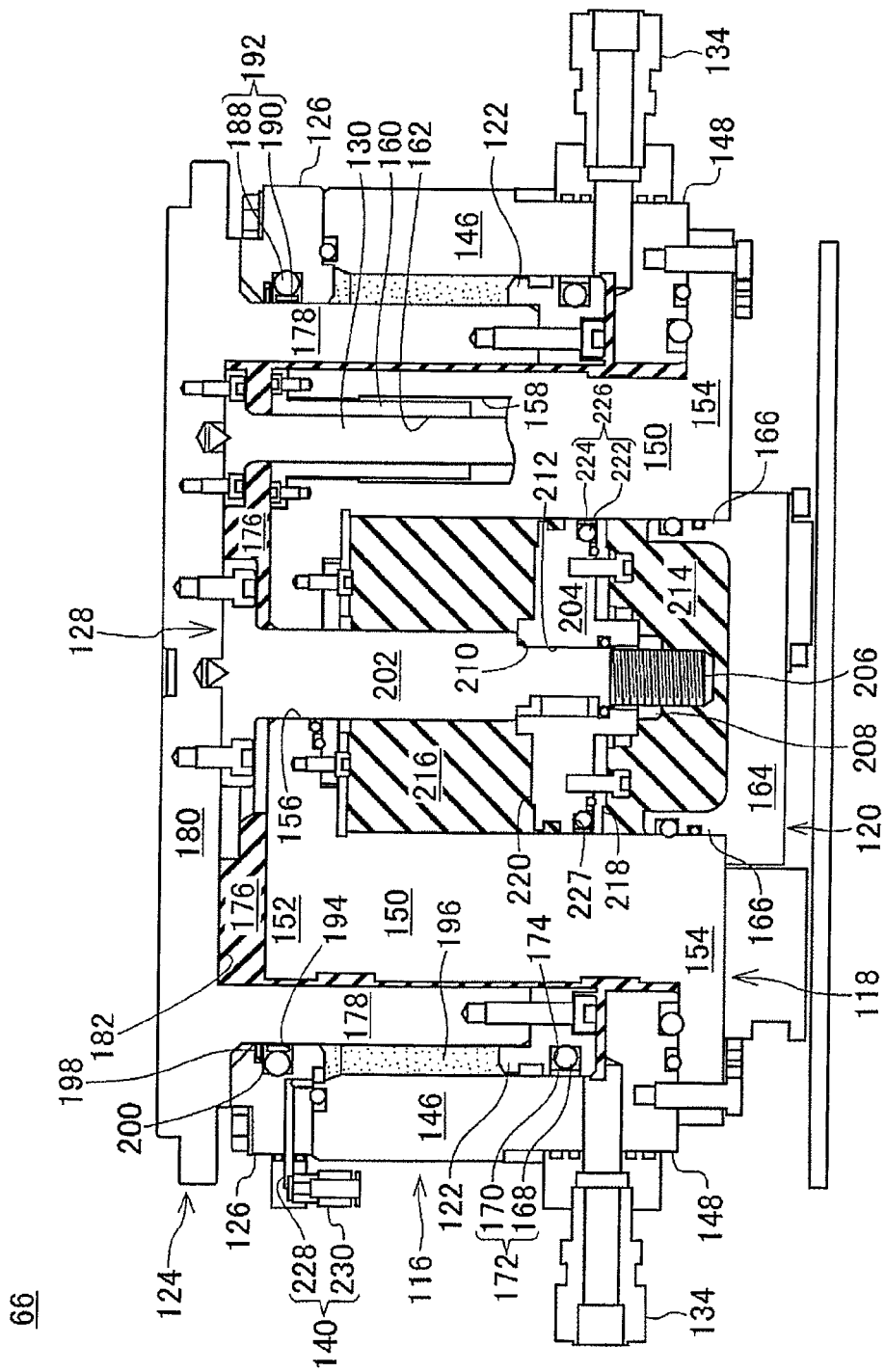
FIG. 9 is a longitudinal sectional view of an elevator section 66.
Figure 10:
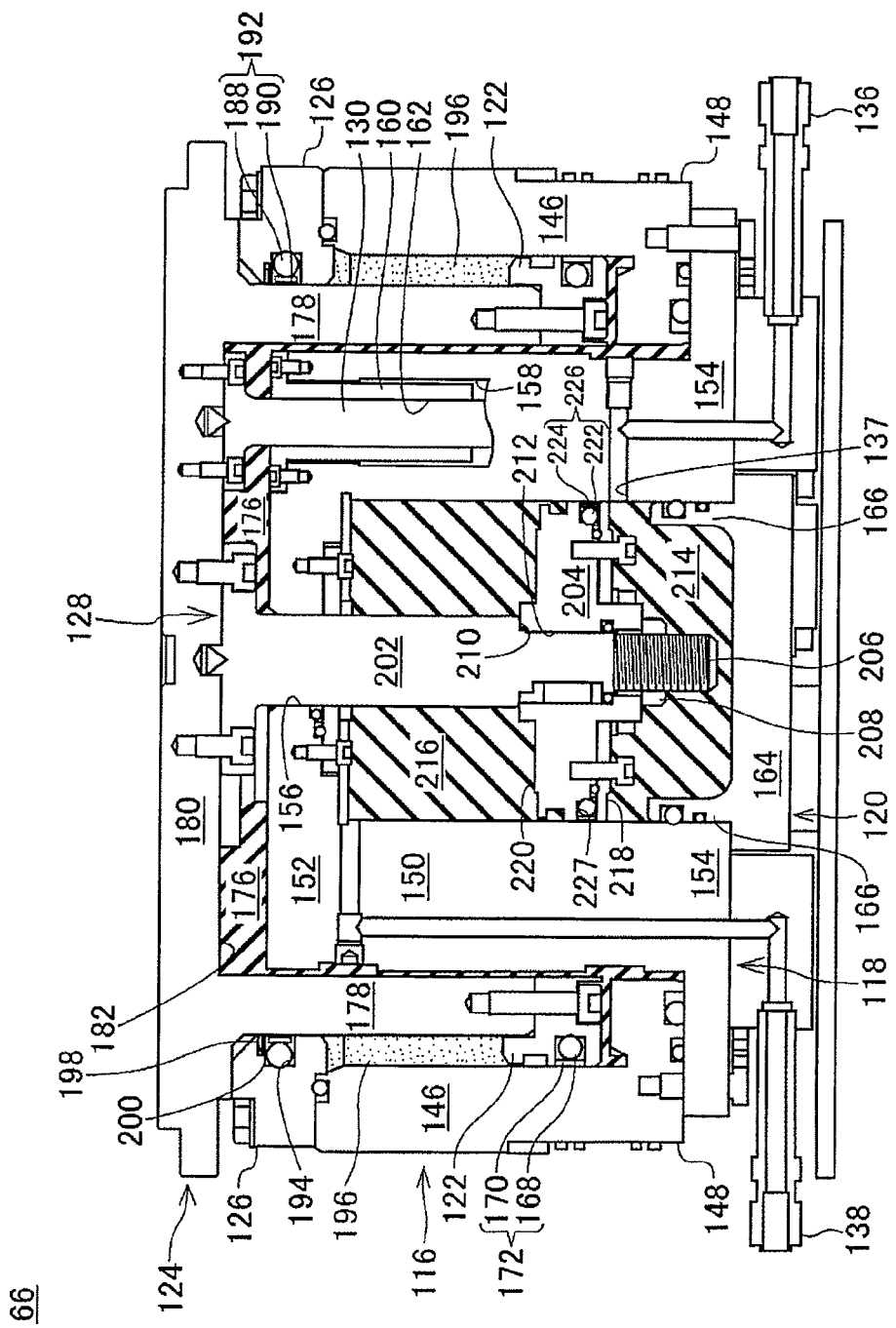
FIG. 10 is a longitudinal sectional view of an elevator section 66.
Figure 11:
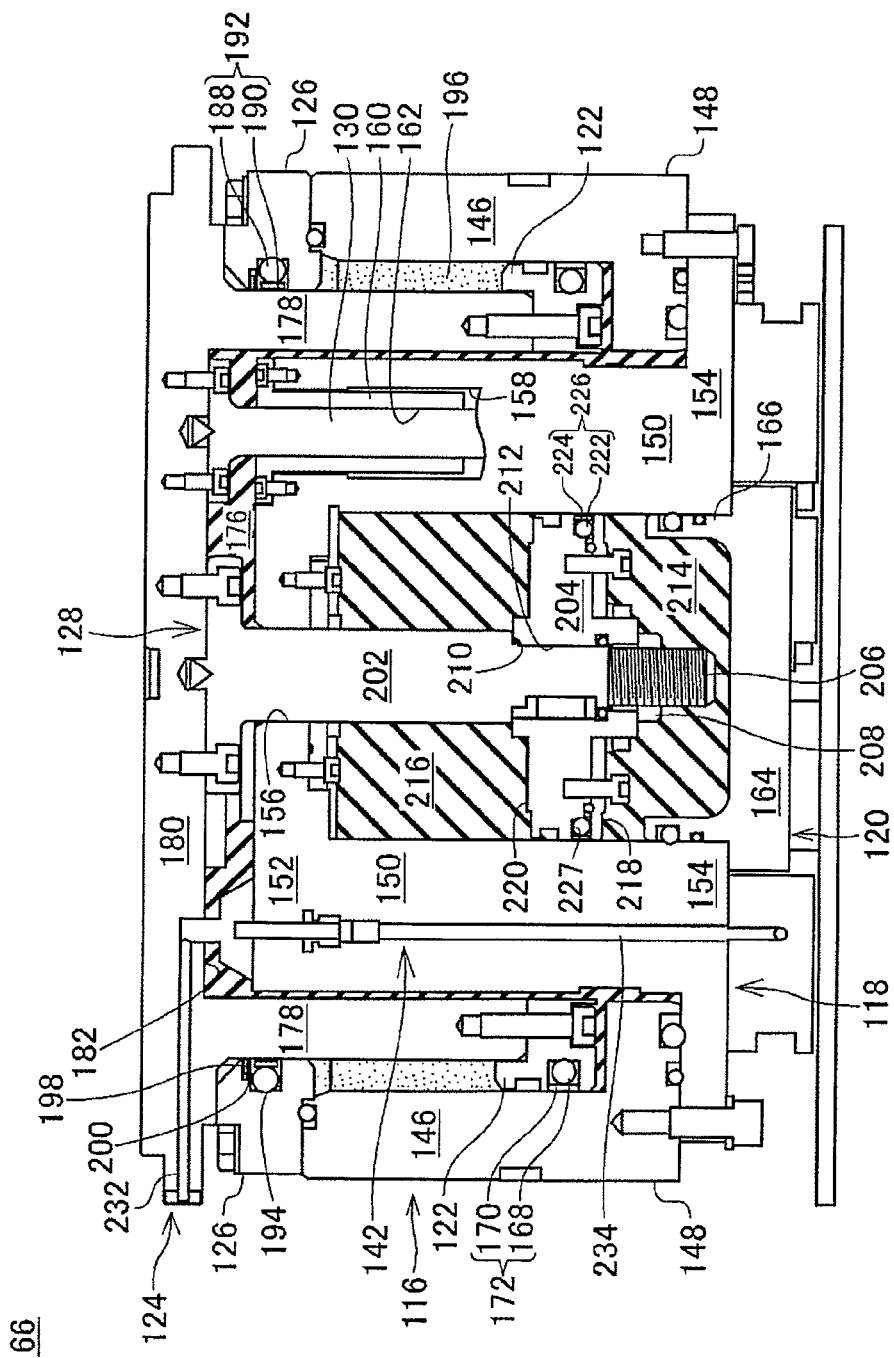
FIG. 11 is a longitudinal sectional view of an elevator section 66.
Figure 12:
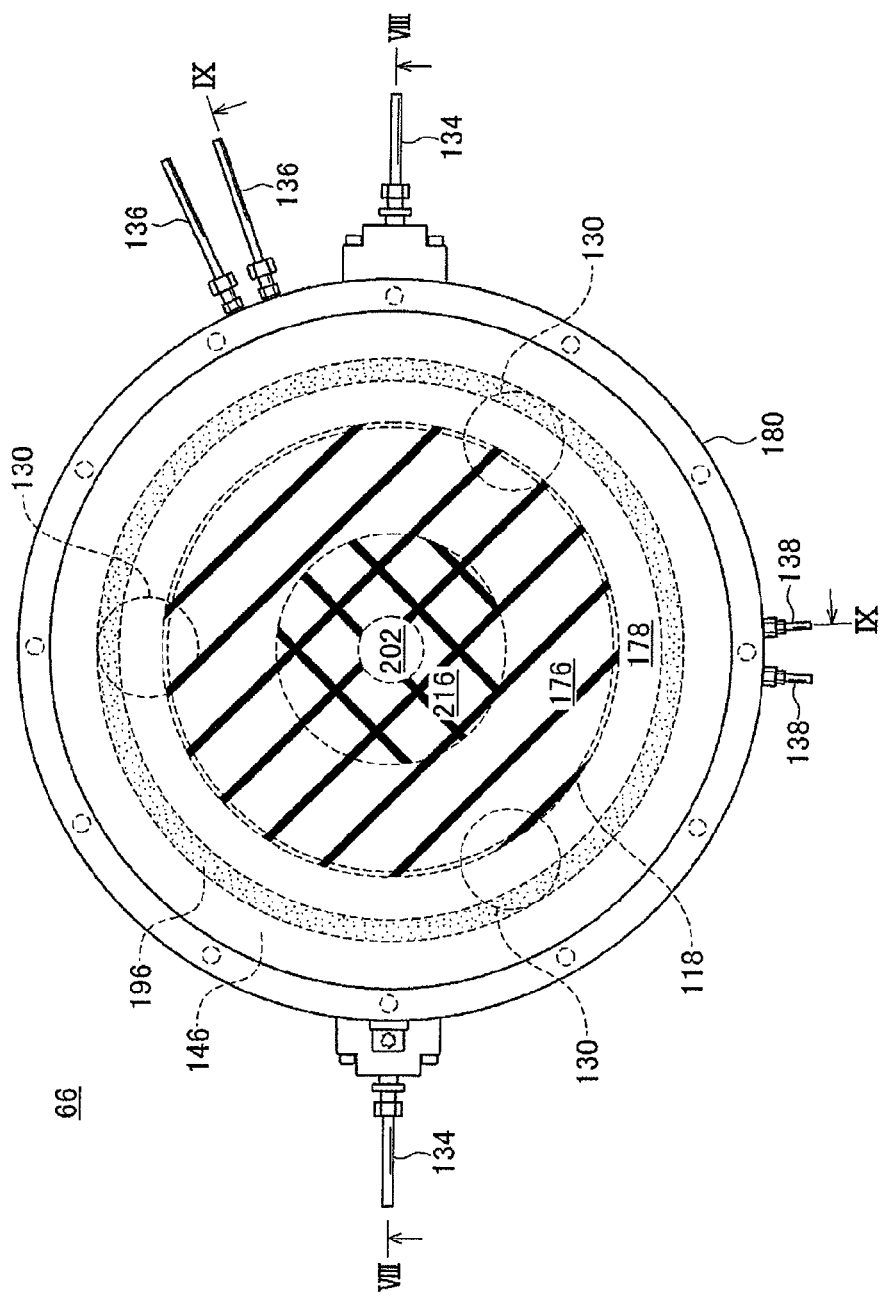
FIG. 12 is a plan view of an elevator section 66.

FIG. 9, FIG. 10, and FIG. 11 each show a longitudinal sectional view of a heating and pressing apparatus. FIG. 12 is a plan view of a stage apparatus. FIG. 9 is a longitudinal sectional diagram of FIG. 12 cut along VIII-VIII line. FIG. 10 is a longitudinal sectional diagram of FIG. 12 cut along IX-IX line. FIG. 11 is a longitudinal sectional diagram of FIG. 12 cut along X-X line. Note that in the sectional view of FIG. 9 through FIG. 11, hatching is drawn to the space for facilitating explanation. Also in FIG. 12, the hatching in the same direction as in FIG. 9 through FIG. 11 is drawn to the same space.

As shown in FIG. 9 through FIG. 12, the elevator section 66 includes an outer housing 116, an inner housing 118, a cylinder lid 120, a second piston lower portion 122, a moving stage member 124, an upper sealing member 126, a driving force conveying section 128, a guide rod 130, a lower heating module 70, a pair of second hydraulic oil A ports 134, 134, a pair of first hydraulic oil A ports 136, 136, a pair of first hydraulic oil B ports 138, 138, a main exhaust section 140, and an air exhausting port 142.

The outer housing 116 is provided to cover the circumference of the elevator section 66. The outer housing 116 includes a second cylinder 146 and an outer bottom 148. The second cylinder 146 is formed as a cylinder hollow elongating in the vertical direction. Accordingly, the second cylinder 146 is formed hollow. The outer bottom 148 is integrally formed with the second cylinder 146. The outer bottom 148 elongates from the lower edge to the inside of the second cylinder 146, to be formed as a ring.

The substantial entirety of the inner housing 118 is provided inside the outer housing 116. The inner housing 118 includes a first cylinder 150, an upper circular plate section 152, and a lower annular plate section 154.

The first cylinder 150 is formed as a cylinder hollow elongating in the vertical direction. Accordingly, the first cylinder 150 is formed hollow. The outer surface of the first cylinder 150 opposes the inner peripheral surface of the second cylinder 146. Because the outer diameter of the first cylinder 150 is smaller than the inner diameter of the second cylinder 146, a space is provided to contain the second piston rod 178, between the outer surface of the first cylinder 150 and the inner surface of the second cylinder 146.

The upper circular plate section 152 is integrally formed with the first cylinder 150. The upper circular plate section 152 is formed as a circular plate elongating from the upper edge to inside of the first cylinder 150. The upper circular plate section 152 covers the upper surface of the hollow portion inside the first cylinder 150. A piston rod hole 156 is provided through the central portion of the upper circular plate section 152, so as to insert thereto the driving force conveying section 128. Three guide concave portions 158 are provided to penetrate from the upper surface of the upper circular plate section 152 to half way through the first cylinder 150. A cylindrical guide member 160 is provided inside a guide concave portion 158. A guide hole 162 elongating in the vertical direction is formed through the central portion of the guide member 160.

The lower annular plate section 154 is integrally formed with the first cylinder 150. The lower annular plate section 154 elongates outside the first cylinder 150 from its lower edge. Accordingly, the bottom of the first cylinder 150 is opened. The lower annular plate section 154 is formed as a ring plate. The inner diameter of the lower annular plate section 154 is substantially the same as the inner diameter of the first cylinder 150. The outer portion of the upper surface of the lower annular plate section 154 opposes the lower surface of the outer bottom 148 of the outer housing 116. The outer perimeter of the lower annular plate section 154 is fixed to the lower surface of the outer bottom 148 of the outer housing 116 by a bolt. Two O-rings are provided between the outer portion of the upper surface of the lower annular plate section 154 and the lower surface of the outer bottom 148. Accordingly, the lower portion of the space formed between the outer peripheral surface of the inner housing 118 and the inner peripheral surface of the outer housing 116 is sealed.

The cylinder lid 120 is provided to close the opening at the bottom of the first cylinder 150. The cylinder lid 120 includes a bottom circular plate section 164 and a standing ring section 166.

The bottom circular plate section 164 is formed as a circular plate. The outer perimeter of the bottom circular plate section 164 is larger than the inner perimeter of the first cylinder 150. The upper surface of the outer peripheral portion of the cylinder lid 120 is in contact with the inner peripheral portion of the lower annular plate section 154 of the inner housing 118. Accordingly, the bottom circular plate section 164 closes the bottom of the hollow portion of the inner housing 118. Note that the bottom circular plate section 164 is fixed to the inner housing 118 by means of a fixture such as a bolt not shown in the drawing.

The standing ring section 166 is provided to stand on the upper surface of the bottom circular plate section 164. The standing ring section 166 is formed as a cylinder hollow elongating in the vertical direction. The outer diameter of the standing ring section 166 is substantially the same as the inner diameter of the first cylinder 150 and of the lower annular plate section 154. Consequently, when the standing ring section 166 is inserted into the first cylinder 150 and the lower annular plate section 154, the outer peripheral surface of the standing ring section 166 is substantially in contact with the inner peripheral surfaces of the first cylinder 150 and the lower annular plate section 154. Two O-rings separated from each other in the vertical section are provided on the outer peripheral surface of the standing ring section 166, so as to seal the hollow portion of the inner housing 118 to restrain the hydraulic oil from leaking.

The second piston lower portion 122 is fixed to the lower edge of the moving stage member 124. The second piston lower portion 122 is formed as a ring. The outer diameter of the second piston lower portion 122 is substantially the same as the inner diameter of the second cylinder 146. The second piston lower portion 122 seals the outer perimeter of the hollow portion formed between the outer peripheral surface of the inner housing 118 and the inner peripheral surface of the moving stage member 124. As a result, a second hollow portion 176 enclosed by the second piston lower portion 122, the outer peripheral surface of the inner housing 118, the moving stage member 124, and the inner peripheral surface of the second cylinder 146 is formed. The second hollow portion 176 is filled with a hydraulic oil for facilitating movement of the moving stage member 124 in the vertical direction. The main function of the hydraulic oil supplied in the second hollow portion 176 is to press a substrate via the lower top plate 72. An example of the hydraulic oil is oil, a glycol system liquid, water containing anticorrosion materials. The second piston lower portion 122 includes a lower slipper seal 172 including a lower O-ring 168 and a lower plate ring 170, both made of resin. The lower slipper seal 172 is an example of a first sealing member. The lower slipper seal 172 is provided in a concave portion 174 formed on the outer periphery of the second piston lower portion 122. The lower plate ring 170 is provided on the inner periphery of the lower O-ring 168, and contacts the inner periphery of the second cylinder 146. Accordingly, the second piston lower portion 122 seals the lower edge of the hollow portion formed between the first cylinder 150 and the moving stage member 124. Note that when the gap between the second piston lower portion 122 and the second cylinder 146 is 0.4 mm, an example of the thickness of the lower plate ring 170 is 1.5 mm.

The moving stage member 124 includes a second piston rod 178 and a second piston upper portion 180. The second piston upper portion 180 and the second piston lower portion 122 form a second piston.

The second piston rod 178 is formed as a cylinder hollow elongating in the vertical direction. Accordingly, the second piston rod 178 is formed hollow. The outer diameter of the second piston rod 178 is smaller than the inner diameter of the second cylinder 146. The inner diameter of the second piston rod 178 is larger than the outer diameter of the first cylinder 150. The second piston rod 178 is inserted between the inner peripheral surface of the second cylinder 146 and the first cylinder 150.

The second piston upper portion 180 is indirectly linked to the lower top plate 72. The second piston upper portion 180 is integrally linked to the upper edge of the second piston rod 178. The second piston upper portion 180 is formed as a circular plate. The upper surface of the second piston upper portion 180 is formed flat. Accordingly, the second piston upper portion 180 supports the stacked substrate 92 being an example of a target, as well as serving as a pressing section pressing the substrate holder 94 via the lower heating module 70. The lower surface of the second piston upper portion 180 is pressed by the hydraulic oil contained in the second hollow portion 176, thereby serving as a second upper pressing surface 182. The second piston upper portion 180 is pressed by the hydraulic oil contained in the second hollow portion 176, thereby pressing the lower top plate 72.

At least a portion of the outer peripheral portion of the inner housing 118 and the inner peripheral portion of the moving stage member 124 is provided to enclose the outer perimeter of the first cylinder 150. In addition, the guide member 160 is provided between the first cylinder 150 and the second cylinder 146. The lower slipper seal 172 is provided between the second hollow portion 176 formed in the second cylinder 146 and outside.

The upper sealing member 126 is fixed to the upper edge of the outer housing 116. The upper sealing member 126 is formed as a ring. The inner diameter of the upper sealing member 126 is substantially the same as the outer diameter of the second piston rod 178. The upper sealing member 126 includes an upper slipper seal 192 including an upper O-ring 188 and an upper plate ring 190, both formed as a ring made of resin. The upper slipper seal 192 is an example of a second sealing member. The upper slipper seal 192 is provided in a concave portion 194 formed on the entire inner periphery of the upper sealing member 126. Accordingly, the upper slipper seal 192 is provided inside the second cylinder 146 and between the second hollow portion 176 and outside, and that outer than the lower slipper seal 172. The upper plate ring 190 is provided on the inner periphery of the upper O-ring 188, and contacts the outer periphery of the second piston rod 178. The upper sealing member 126 seals the upper edge of the hollow portion formed between the second cylinder 146 and the second piston rod 178. Note that when the gap between the upper sealing member 126 and the second piston rod 178 is 0.4 mm, an example of the thickness of the upper plate ring 190 is 1.5 mm. A gas chamber 196 enclosed by the second piston lower portion 122, the inner periphery of the second cylinder 146, the outer periphery of the moving stage member 124, and the upper sealing member 126 is formed between the second piston lower portion 122 and the upper sealing member 126. The gas chamber 196 is filled with a gas such as air. The upper sealing member 126 includes an auxiliary seal 198 having a sponge-like form made of resin. The auxiliary seal 198 is provided in an auxiliary concave portion 200 which is an inner peripheral portion of the upper sealing member 126 and is formed above the concave portion 194.

The driving force conveying section 128 includes a piston rod 202, a first piston 204, and a nut 208 being an example of a removable member.

The piston rod 202 is a columnar shaft (i.e. rod) for conveying a thrust force of the first piston 204 and is connected to the second piston upper portion 180. The piston rod 202 is inserted to the piston rod hole 156 of the upper circular plate section 152. The upper edge of the piston rod 202 is linked to the central portion of the lower surface of the second piston upper portion 180. Accordingly, the piston rod 202 presses the center of mass of the moving stage member 124. The lower edge of the piston rod 202 is a columnar shaft having steps 210, and fastens the first piston 204 between the nut 208 and the steps 210. The area of the steps 210 is set to be an adequate area depending on the fastening force of the nut 208. The steps 210 restrain the upward movement of the first piston 204.

The first piston 204 is indirectly linked to the lower top plate 72 via the piston rod 202 and the moving stage member 124 or the like. The first piston 204 is formed as a disk. A hole 212, to which the piston rod 202 is fit, is provided through the central portion of the first piston 204. The first piston 204 has an outer diameter substantially matching the inner diameter of the first cylinder. Therefore, the inside space of the first cylinder 150 is separated between the first lower hollow portion 214 and the first upper hollow portion 216. The first lower hollow portion 214 and the first upper hollow portion 216 are a space below the lower top plate 72, and are provided inside the second hollow portion 176 so that at least a part of them overlaps with the second hollow portion 176 in the moving direction of the lower top plate 72. The piston rod hole 156 of the first upper hollow portion 216 is sealed by means of a packing, to be kept airtight. The lower side of the first lower hollow portion 214 is closed by the aforementioned cylinder lid 120, and so is likewise kept airtight. Both of the first lower hollow portion 214 and the first upper hollow portion 216 are an example of a first hollow portion and a second hollow portion separated from each other. The first lower hollow portion 214 and the first upper hollow portion 216 are filled with hydraulic oil, which is an example of a liquid for facilitating reciprocation movement of the moving stage member 124 via the driving force conveying section 128 in the vertical direction. The main function of the hydraulic oil supplied to the first lower hollow portion 214 and the first upper hollow portion 216 is to raise and lower the lower top plate 72.

Once the hydraulic oil is supplied to the first lower hollow portion 214, the hydraulic oil presses a first lower pressing surface 218 of the first piston 204, thereby moving the driving force conveying section 128 upward. Once the hydraulic oil is supplied to the first upper hollow portion 216, the hydraulic oil presses a first upper pressing surface 220 of the first piston 204, thereby moving the driving force conveying section 128 downward. As a result, the driving force conveying section 128 is moved back and forth by the first cylinder 150 in the vertical direction. Here, even when the first piston 204 has moved in the lowest edge, the concave portion 227 formed on the outer periphery of the first piston 204 is positioned above the opening 137 of the first hydraulic oil A port 136 linked to the first lower hollow portion 214, to prevent breakage of the later-detailed slipper seal 226. Here, in the driving force conveying section 128, the area pressed by the hydraulic oil of the second hollow portion 176 upwardly in the vertical direction is larger than the area pressed by the hydraulic oil of the first lower hollow portion 214 and the first upper hollow portion 216 upwardly in the vertical direction. Furthermore, in the embodiments shown in FIG. 9 through FIG. 12, the area of the second upper pressing surface 182 pressed by the hydraulic oil of the second hollow portion 176 is larger than the area of the first lower pressing surface 218 and the first upper pressing surface 220 pressed by the hydraulic oil of the first lower hollow portion 214 and the first upper hollow portion 216. Accordingly, the pressing force given by the second piston upper portion 180 to the lower top plate 72 is larger than the pressing force given by the piston rod 202 to the lower top plate 72.

The first piston 204 includes a slipper seal 226 including an O-ring 222 and a seal ring 224. The slipper seal 226 is provided in a concave portion 227. The seal ring 224 is provided outer than the O-ring 222. Accordingly, the seal ring 224 contacts the inner peripheral surface of the first cylinder 150 of the inner housing 118.

Figure 13:
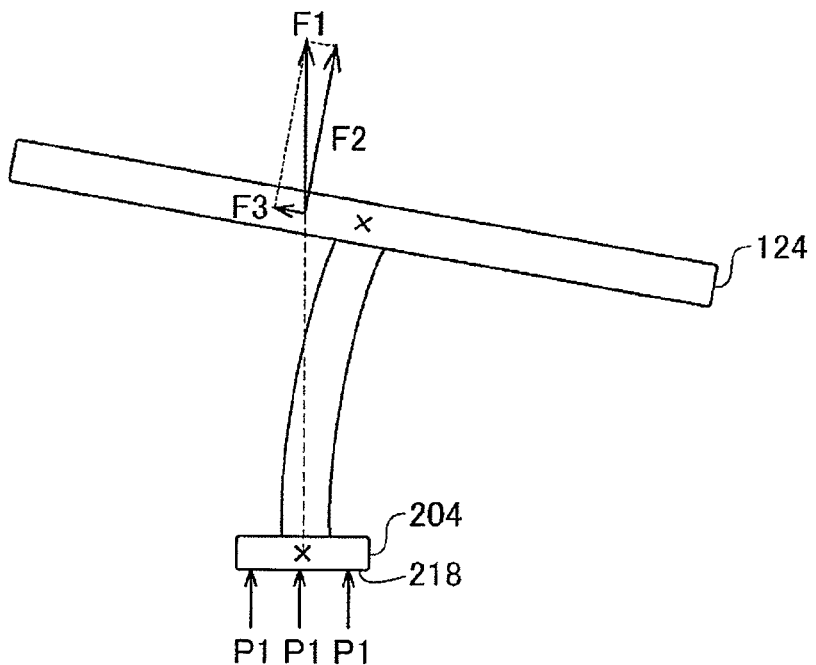
FIG. 13 explains a power exerted onto a moving stage member 124 in a tilted state.
Figure 14:
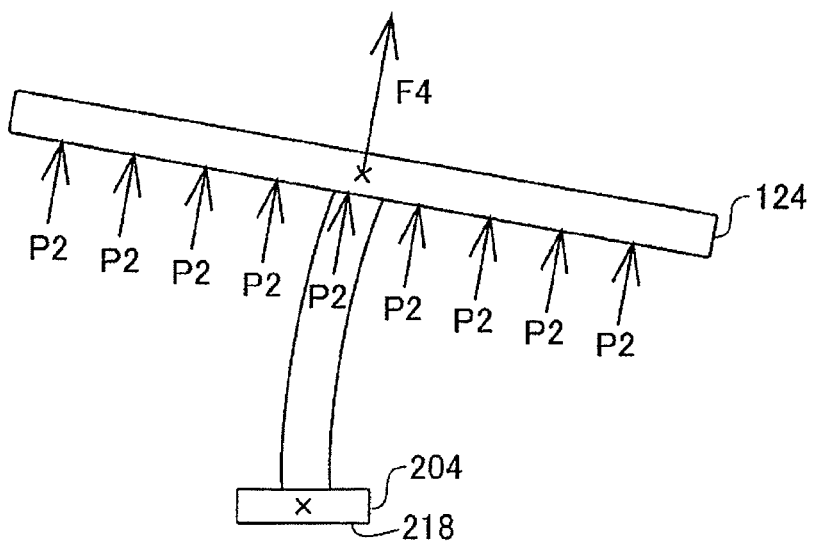
FIG. 14 explains a power exerted onto a moving stage member 124 in a tilted state.

FIG. 13 and FIG. 14 explain a power exerted onto a moving stage member in a tilted state. The second upper pressing surface 182 of the moving stage member 124 pressed by the second cylinder 146 is closer to the second piston upper portion 180, than the first lower pressing surface 218 of the first piston 204 pressed by the hydraulic oil of the first cylinder 150. Here, when attempting to press the moving stage member 124 by means of the pressure P1 exerted onto the first lower pressing surface 218 as shown in FIG. 13, if the moving stage member 124 is in a tilted state, the resultant force F1 by the pressure P1 is not applied to the center of mass of the moving stage member 124, and moreover the component F3 in the direction of the surface of the moving stage member 124 will result, which may decrease the force F2 actually pressing the object. In contrast, by making the second upper pressing surface 182 of the moving stage member 124 press the moving stage member 124 by the pressure P2, the resultant force F4 will be applied to the center of mass of the moving stage member 124, as well as allowing pressing in the direction vertical to the surface direction of the moving stage member 124 according to the tilt. In addition, the second upper pressing surface 182 presses the moving stage member 124 in a larger area than the area pressed by the piston rod 202. Therefore, when a larger driving force is exerted onto the piston rod 202 which presses only the area in the vicinity of the center of the moving stage member 124, the central portion of the moving stage member 124 may protrude. However, when a large driving force is exerted onto the second upper pressing surface 182 having a larger pressing area, the moving stage member 124 can be maintained flat in pressing the substrate 90.

The male screw portion 206 is formed on an edge opposite to the second piston upper portion 180 of the piston rod 202. The nut 208 is screwed together with the male screw portion 206 formed on the lower edge of the piston rod 202. Accordingly, the first piston 204 is fixed by the steps 210 and the nut 208 from below and above. The lower edge of the nut 208 is distant from the upper surface of the cylinder lid 120 at an allowed distance or above. An example of the allowed distance is a distance at which the reciprocation movement of the moving stage member 124 is not prohibited even when the nut 208 has loosened to be moved below. In view of this, it is determined abnormal if the lower surface of the nut 208 or the lower surface of the first piston 204 reaches the cylinder lid 120, when the moving stage member 124 has moved down to the lowest edge when the nut 208 has moved to the loosened portion below, for the reason of not able to make the moving stage member 124 move down to the lowest edge.

Guide rods 130 are indirectly linked to the lower top plate 72. Three guide rods 130 are arranged with the second piston upper portion 180 on their center, with the interval of 120 degrees thereamong. Note that although the number of guide rods 130 may be changed if necessary, it is preferable to arrange the guide rods 130 with an interval of a constant degree around the center of the second piston upper portion 180.

The guide rods 130 are formed in substantially a cylindrical formation. The upper edge of the guide rod 130 is linked to the lower surface of the second piston upper portion 180. The guide rod 130 is inserted to the guide hole 162 formed on the guide member 160. Accordingly, the guide rod 130 will be arranged between the first lower hollow portion 214 and the first upper hollow portion 216, and the second hollow portion 176. The outer diameter of the guide rod 130 is substantially the same as the inner diameter of the guide hole 162. Accordingly, when the guide rods 130 are moved back and forth up and down together with the moving stage member 124, the guide rods 130 are guided up and down that is in accordance with the reciprocation movement by the guide member 160. In addition, the second upper pressing surface 182 is closer to the second piston upper portion 180 than the position to which the guide member 160 guides the guide rods 130. Accordingly, as explained with reference to FIG. 13 and FIG. 14, a larger resultant force can be exerted in the surface direction of the movement stage member 124.

The lower heating module 70 is fixed to the upper surface of the moving stage member 124. The lower heating module 70 includes a heater to heat the stacked substrate 92. The upper surface of the lower heating module 70 heats the stacked substrate 92 as well as serving as a pressing surface to press the lower surface of the stacked substrate 92.

A pair of second hydraulic oil A ports 134, 134 connect the second hollow portion 176 to outside. The second hydraulic oil A ports 134, 134 supply hydraulic oil to the second hollow portion 176, or exhausts the hydraulic oil from the second hollow portion 176. Accordingly, the moving stage member 124 moves in the vertical direction when the hydraulic oil is supplied and exhausted. The pair of second hydraulic oil A ports 134, 134 are provided to oppose each other, with the center of the moving stage member 124 in between.

A pair of first hydraulic oil A ports 136, 136 connect the first lower hollow portion 214 to outside. The pair of first hydraulic oil A ports 136, 136 supply hydraulic oil to the first lower hollow portion 214, or exhausts the hydraulic oil from the first lower hollow portion 214. A pair of first hydraulic oil B ports 138, 138 connect the first upper hollow portion 216 to outside. The first hydraulic oil B ports 138, 138 supply hydraulic oil to the first upper hollow portion 216, or exhausts the hydraulic oil from the first upper hollow portion 216. Accordingly, the driving force conveying section 128 moves in the vertical direction together with the moving stage member 124. Here, the pair of first hydraulic oil A ports 136, 136 and the pair of first hydraulic oil B ports 138, 138 are an example of a first exhaust section that is provided for the first lower hollow portion 214 and the first upper hollow portion 216 respectively and exhausts a gas mixed in the hydraulic oil contained in the first lower hollow portion 214 and the first upper hollow portion 216 to outside. For example, one of the first hydraulic oil A ports 136 is used to supply hydraulic oil to the first lower hollow portion 214, and the other first hydraulic oil A port 136 is used to exhaust the hydraulic oil into which gas has been mixed from the first lower hollow portion 214. Likewise, the first hydraulic oil B ports 138, 138 are used to exhaust the gas mixed into the hydraulic oil in the first upper hollow portion 216.

The main exhaust section 140 includes an exhaust passage 228 and a vent 230. The exhaust passage 228 is formed inside the upper seal member 126. The exhaust passage 228 connects, to outside, the gas chamber 196 formed between the second cylinder 146 and the second piston rod 178. The vent 230 is provided at an outer edge of the exhaust passage 228. The vent 230 is connected to a pump not illustrated in the drawings. Accordingly, by the main exhaust section 140, the gas chamber 196 is exhausted and the hydraulic oil leaked from the second hollow portion 176 to the gas chamber 196 is exhausted.

The air-bleeding port 142 is an example of a second exhaust section. The air-bleeding port 142 includes an upper gas removal passage 232 and a lower gas removal passage 234. The upper gas removal passage 232 is formed from the lower surface to the side surface of the outer peripheral portion of the second piston upper portion 180. Accordingly, the upper gas removal passage 232 connects the second hollow portion 176 to outside. The upper gas removal passage 232 exhausts, to outside, the gas mixed in the hydraulic oil contained in the second hollow portion 176 and lingering in the upper portion. The lower gas removal passage 234 is formed from the upper surface of the outer peripheral portion of the upper circular plate portion 152 to the lower surface of the lower annular plate portion 154. Accordingly, the lower gas removal passage 234 passes below the upper gas removal passage 232. The lower gas removal passage 234 is connected to a pump not illustrated in the drawings. Accordingly, the lower gas removal passage 234 exhausts, to outside, the gas mixed in the hydraulic oil contained in the second hollow portion 176 and lingering in the upper portion. The upper gas removal passage 232 is used to exhaust gas before complete assembly of the elevator section 66 and in the state in which the hydraulic oil is first supplied to the second hollow portion 176. On the other hand, the lower gas removal passage 234 is used after assembly of the heating and pressing apparatus 56 and when it is difficult to exhaust gas from the upper gas removal passage 232. Although not illustrated, the first upper hollow portion 216 and the first lower hollow portion 214 are respectively provided with an air-bleeding port.

The control section 18 of the substrate bonding apparatus 10 controls the elevator section 66. In other words, the elevator section 66 includes the control section 18. For example, when the second piston upper portion 180 performs pressing, the control section 18 controls the pressing force of the second piston upper portion 180 so that at least one of the lower top plate 72 and the upper top plate 82 has a predetermined pressure distribution. In addition, the control section 18 controls to decrease the speed of the lower top plate 72 when the lower top plate 72 removes, from the push-up pin 73, the pair of substrates 90 mounted to the push-up pin 73. The control section 18 controls to decrease the speed of the lower top plate 72 before the pair of substrates 90 supported by the lower top plate 72 are sandwiched between the lower top plate 72 and the upper top plate 82. The control section 18 is an example of a first leak detecting section, a second leak detecting section, and an abnormality determining section.

The control section 18 detects an amount of hydraulic oil supplied to the second hollow portion 176, the first lower hollow portion 214, and the first upper hollow portion 216. The control section 18 detects an amount of movement of the moving stage member 124 and the driving force conveying section 128 in the vertical direction. Then, the control section 18 compares the amount of supplied hydraulic oil and the amount of movement of the moving stage member 124 and the driving force conveying section 128. When the amount of the hydraulic oil does not match the amount of movement, it is determined and detected that hydraulic oil is leaked from any of the second hollow portion 176, the first lower hollow portion 214, and the first upper hollow portion 216.

In addition, the control section 18 detects leak of hydraulic oil between the first lower hollow portion 214 and the first upper hollow portion 216, when the moving stage member 124 has moved in the vertical direction while neither supply nor exhaustion of hydraulic oil is performed. Accordingly, it is possible to detect breakage of the slipper seal 226.

In addition, the control section 18 determines that the position of the nut 208 is abnormal, by detecting the loosening of the nut 208 by contact of the nut 208 or the first piston 204 to the cylinder lid 120. For example, when the amount of hydraulic oil required to move the moving stage member 124 to the lowest edge has been supplied or exhausted, and if the moving stage member 124 does not move to the lowest edge, the control section 18 determines that the nut 208 is abnormal. The reason is that since the nut 208 has been loosened and the nut 208 has moved lower than the piston rod 202 for more than the allowed distance, either the nut 208 or the first piston 204 contacts the cylinder lid 120 to restrain the downward movement.

Next, the heating and pressing operation by the aforementioned heating and pressing apparatus 56 is explained. First, the robot arm 54 conveys the stacked substrate 92 held by the substrate holders 94, 94 to the upper surface of the lower heating module 70. Thereafter, the robot arm 54 comes back, thereby causing the stacked substrate 92 to be held by the second piston upper portion 180 via the lower heating module 70.

Next, the valve connected to a passage between the second hydraulic oil A port 134 and an unillustrated tank in the apparatus. Note that the tank in the apparatus is set immediately below the elevator section 66, and stores therein hydraulic oil. Accordingly, the hydraulic oil in the tank in the apparatus can freely flow between the tank in the apparatus and the second hollow portion 176. In this state, a pressure is applied to the first hydraulic oil A ports 136, 136, to introduce the hydraulic oil, to supply the hydraulic oil to the first lower hollow portion 214, as well as exhaust the hydraulic oil from the first upper hollow portion 216 via the first hydraulic oil B ports 138, 138. Accordingly, the driving force conveying section 128 is moved upward. In accordance with this operation, the moving stage member 124 moves upward together with the driving force conveying section 128. In addition, the hydraulic oil flows into the second hollow portion 176 from the tank in the apparatus via the second hydraulic oil A port 134. Note that the raising speed the moving stage member 124 can be controlled by adjusting the pressure and the flow rate used in introducing the hydraulic oil of the first hydraulic oil A ports 136, 136.

Figure 15:
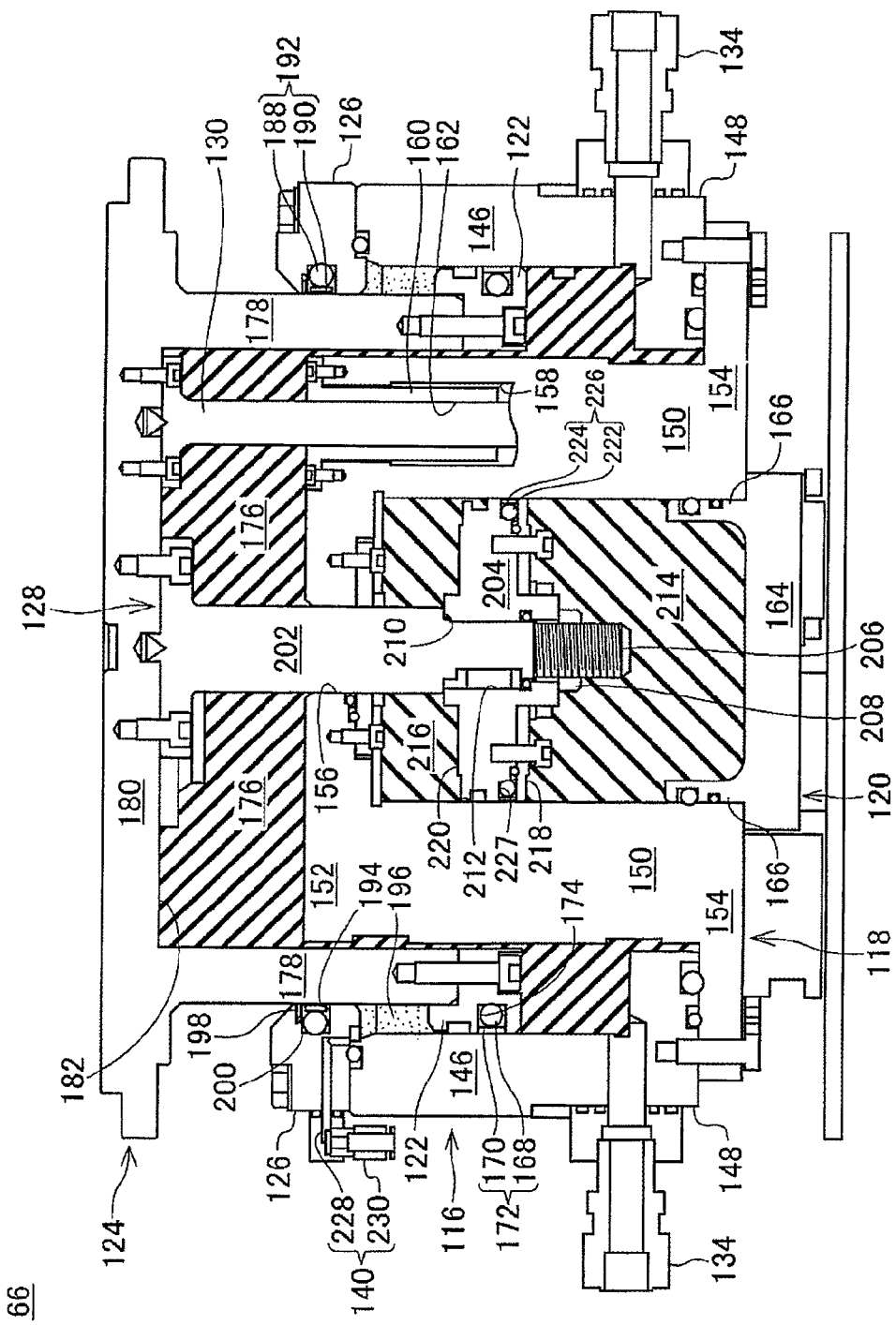
FIG. 15 shows a state of the moving stage member 124 having reached the highest level.

FIG. 15 shows a state of the moving stage member having reached the highest level. As shown in FIG. 15, when the moving stage member 124 has reached the highest level, the upper surface of the upper substrate holder 94 contacts the lower surface of the upper heating module 80. In this state, the lower heating module 70 and the upper heating module 80 start heating the stacked substrate 92. Then, the lower heating module 70 and the upper heating module 80 raise the temperature of the stacked substrate 92 up to the coupling temperature at which the substrates 90, 90 of the stacked substrate 92 can be coupled together, and subsequently maintains the raised temperature. In addition, the valve on the passage between the second hydraulic oil A port 134 and the tank in the apparatus is closed. Accordingly, the hydraulic oil in the second hollow portion 176 is sealed airtight. In this state, a predetermined pressure is given from a branch tube provided on the aforementioned passage through a pressure reducing valve of another hydraulic source.

Accordingly, the moving stage member 124 exerts a surface pressure to the entire substrate holders 94, 94, to apply a real pressure to the stacked substrate 92 while being heated. By keeping this heated and pressed state, the substrates 90, 90 of the stacked substrate 92 are coupled to each other.

After this, if the real pressing is ended, the pressure of the pressure reducing valve is decreased, to release the pressure exerting on the stacked substrate 92. When all the pressure by the second cylinder 146 is released, the valve on the passage between the second hydraulic oil A port 134 and the tank in the apparatus is opened, to allow the hydraulic oil of the second hollow portion 176 to freely flow into the tank in the apparatus. After this, a pressure is given to the first hydraulic oil B port 138, to introduce the hydraulic oil, as well as to exhaust the hydraulic oil from the first hydraulic oil A port 136. Accordingly, the moving stage member 124 moves downward.

Once the moving stage member 124 has moved to the initial position shown in FIG. 9, the robot arm 58 conveys the stacked substrate 92 together with the substrate holder 94 to the cooling chamber 59.

Next, the maintenance method of the elevator section 66 is explained. Note that the maintenance method mentioned here relates to exhaustion of the gas mixed in the hydraulic oil of the second hollow portion 176, the first lower hollow portion 214 and the first upper hollow portion 216, as well as exhaustion of the gas mixed in the gas chamber 196.

When a gas is mixed in the second hollow portion 176, as a preparation, the exhaustion container is connected to the air-bleeding port 142 via the pipes. The gas is exhausted by the air-bleeding port 142. For example, prior to complete assembly of the elevator section 66, gas is exhausted to the exhaust container via the upper gas removal passage 232 of the air-bleeding port 142. In this case, the gas is exhausted by fixing the moving stage member 124 to the highest level by supplying the hydraulic oil to the first lower hollow portion 214. Since a gas lingers on the upper portion, the gas will be assuredly and easily exhausted. On the other hand, once the elevator section 66 is assembled and complete, it becomes difficult to exhaust the gas via the upper gas removal passage 232. In this case, the upper gas removal passage 232 is closed, and hydraulic oil is supplied to the first upper hollow portion 216, and the moving stage member 124 is moved to the lowest level and fixed. While keeping this state, the hydraulic oil can be supplied via the second hydraulic oil A port 134 while exhausting the hydraulic oil from the lower gas removal passage 234. Accordingly, the gas mixed in the hydraulic oil can be exhausted together with the hydraulic oil exhausted from the lower gas removal passage 234.

When the gas is mixed in the first lower hollow portion 214, as a preparation, the exhaustion container is connected to the hydraulic oil A port 136 via the pipes. A pressure is exerted by supplying a pressure to the first lower hollow portion 214 via the first hydraulic oil B port 138. Accordingly, low-pressure hydraulic oil to which no pressure is exerted is exhausted from the first lower hollow portion 214 via the first hydraulic oil A port 136. Accordingly, the gas mixed in the hydraulic oil is exhausted to the exhaustion container together with the hydraulic oil via the other first hydraulic oil A port 136. When the exhausted hydraulic oil does not contain any gas and contain only hydraulic oil, the air-bleeding ends. Thereafter, the exhaustion container and the pipes are removed from the first hydraulic oil A port 136, to end the process. Likewise, when gas is mixed into the hydraulic oil of the first upper hollow portion 216, the gas is exhausted through the first hydraulic oil B ports 138, 138.

When a hydraulic oil is mixed in the gas chamber 196, the gas is exhausted from the main exhaust section 140, to exhaust the hydraulic oil together with the gas.

Here, the gas chamber 196 is sealed airtight other than the passage of the main exhaust section 140 during heating and pressing. Accordingly, the hydraulic oil mixed in the gas chamber 196 is exhausted to outside the elevator section 66, to restrain the inside of the substrate bonding apparatus 10 from being contaminated.

Next, the abnormal detection of the elevator section 66 is explained. Note that the abnormal detection meant here includes loosening of the nut 208 and leakage of hydraulic oil.

When the nut 208 has been loosened, the nut 208 moves lower towards the piston rod 202. When the moving distance of the nut 208 to the piston rod 202 is within a range of an allowed distance, even when the moving stage member 124 moves down to the lowest edge, the lower edge of the nut 208 will not contact the upper surface of the cylinder lid 120. In this state, the control section 18 does not detect the loosening of the nut 208. On the other hand, when the moving distance of the nut 208 has exceeded the range of the allowed distance, the lower edge of the nut 208 will contact the upper surface of the cylinder lid 120 before the moving stage member 124 moves to the lowest edge. Accordingly, even when the hydraulic oil is exhausted from the second hollow portion 176 and the first lower hollow portion 214, the moving stage member 124 will be restrained from moving downward, and therefore the control section 18 determines abnormality attributed to loosening of the nut 208.

In moving the moving stage member 124 upward, when the moving amount of the moving stage member 124 is small compared to the supplied amount of the hydraulic oil to the first lower hollow portion 214, it means that the hydraulic oil is leaking through the slipper seal 226 or the like, and so the control section 18 will determine that the slipper seal 226 is broken. In addition, in this state, the hydraulic oil will be supplied to the second hollow portion 176 via the second hydraulic oil A port 134. Here, when the moving amount of the moving stage member 124 is small compared to the supplied amount of the hydraulic oil to the second hollow portion 176, the hydraulic oil is leaking through the lower slipper seal 172, and so the control section 18 will determine that the lower slipper seal 172 or the like is broken.

In moving the moving stage member 124 downward, when the moving amount of the moving stage member 124 is small compared to the supplied amount of the hydraulic oil to the first upper hollow portion 216, the hydraulic oil is leaking through the slipper seal 226 or the like, and so the control section 18 will determine that the slipper seal 226 or the like is broken.

When the hydraulic oil has been accumulated in the first lower hollow portion 214 and the first upper hollow portion 216, the first hydraulic oil A ports 136, 136, and the first hydraulic oil B ports 138, 138 are closed, to stop supplying hydraulic oil. In this state, when having detected movement of the moving stage member 124, the control section 18 determines that the slipper seal 226 is broken. This is because the movement of the moving stage member 124 is attributed to the breakage of the slipper seal 226 which causes the flux of the hydraulic oil between the first lower hollow portion 214 and the first upper hollow portion 216.

As mentioned above, the elevator section 66 of the substrate bonding apparatus 10 according to the present embodiment includes a driving force conveying section 128 having a first lower pressing surface 218 and a first upper pressing surface 220, which are different from the area of the second upper pressing surface 182 of the moving stage member 124. Accordingly, the driving force conveying section 128 including the first lower pressing surface 218 and the first upper pressing surface 220, having a smaller area, can increase the moving speed of the moving stage member 124, as well as the moving stage member 124 including a second upper pressing surface 182 having a larger area can press the stacked substrate 92 at a higher pressure.

In the elevator section 66, the second piston rod 178 of the moving stage member 124 including the second upper pressing surface 182 having a larger area is provided outside the driving force conveying section 128. Therefore, the elevator section 66 can be smaller than in the case in which the first lower pressing surface 218 and the first upper pressing surface 220 of the driving force conveying section 128 positioned inside are made larger. In addition, the elevator section 66 having the second upper pressing surface 182 overlapped with the first lower pressing surface 218 and the first upper pressing surface 220 can have an even smaller size.

In the elevator section 66, the second upper pressing surface 182 of the moving stage member 124 is positioned closer to the second piston upper portion 180 than the first lower pressing surface 218 and the first upper pressing surface 220 of the driving force conveying section 128. Accordingly, even when the second piston upper portion 180 is tilted, the tilt of the stacked substrate 92 can be made smaller than the tilt of the driving force conveying section 128. As a result, the effect of the tilt due to a larger pressure can be made smaller, and so it is possible to improve the evenness of a pressure within the surface to the stacked substrate 92, to reduce the coupling defect of the stacked substrate 92.

In the elevator section 66, the second upper pressing surface 182 of the moving stage member 124 is positioned closer to the second piston upper portion 180 than the position to which the guide member 160 guides the guide rod 130. Accordingly, even when the second piston upper portion 180 is tilted, the tilt of the stacked substrate 92 can be made smaller than the tilt of the guide rod 130. As a result, it is possible to reduce the coupling defect of the stacked substrate 92.

In the elevator section 66, the lower slipper seal 172 and the upper slipper seal 192 are provided between the second hollow portion 176 and outside. Accordingly, incidence of leak of the hydraulic oil of the second hollow portion 176 to outside is reduced. Here, the levels of defectiveness of the lower slipper seal 172 and the upper slipper seal 192 are $1 \times 10^{-4}$ respectively. In this case, the possibility of the hydraulic oil of the second hollow portion 176 leaking to outside through the lower slipper seal 172 and upper slipper seal 192 is $1 \times 10^{-8}$. Accordingly, the outside contamination due to the hydraulic oil of the second hollow portion 176 is reduced. In addition, by forming the gas chamber 196 filled with air between the lower slipper seal 172 and upper slipper seal 192, the hydraulic oil leaked from the second hollow portion 176 can be temporarily stored therein. Accordingly, the leaked hydraulic oil can be removed from the gas chamber 196, thereby further reducing the hydraulic oil leaked to outside.

In the elevator section 66, the lower slipper seal 172 and the upper slipper seal 192 including the lower plate ring 170 and the upper plate ring 190 are used to seal airtight the second hollow portion 176. Accordingly, even when the moving stage member 124 has moved with respect to the outer housing 116, the lower plate ring 170 and the upper plate ring 190 which are sliding resistant due to the surface contact can restrain breakage of the lower slipper seal 172 and the upper slipper seal 192.

The elevator section 66 includes a pair of first hydraulic oil A ports 136, 136, a pair of first hydraulic oil B ports 138, 138, and an air-bleeding port 142, for exhausting the gas mixed into the hydraulic oil of each of the second hollow portion 176, the first lower hollow portion 214, and the first upper hollow portion 216. Accordingly, the gas mixed in the hydraulic oil can be exhausted, thereby reducing the error between the supplied amount or the exhausted amount of the hydraulic oil attributed to the gas mixed in the hydraulic oil and the moving amount of the moving stage member 124. As a result, the accuracy of the moving amount and the pressing force of the moving stage member 124 can improve.

In the elevator section 66, the control section 18 can detect the leak of the hydraulic oil by comparing the moving amount of the moving stage member 124 to the supplied amount of the hydraulic oil. Accordingly, the elevator section 66 can detect leak of the hydraulic oil of the second hollow portion 176, the first lower hollow portion 214, and the first upper hollow portion 216 quickly and that during operation.

When the male screw portion 206 is loosened and the elevator section 66 has moved below the allowed distance or above from the piston rod 202 to be in contact with the cylinder lid 120, the control section 18 can detect the contact between the male screw portion 206 and the cylinder lid 120, to determine abnormality. Accordingly, abnormality of the driving force conveying section 128 can be determined in the early stage, whose detection of abnormality is otherwise difficult because it is positioned inside. This helps prevent serious accidents such as removal of the first piston 204 of the driving force conveying section 128.

Figure 16:
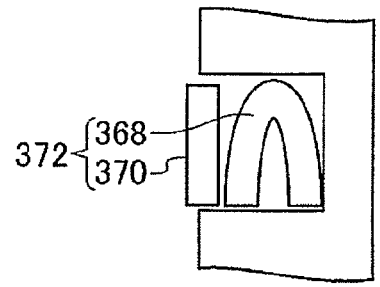
FIG. 16 explains a modification example of a sealing member.
Figure 17:
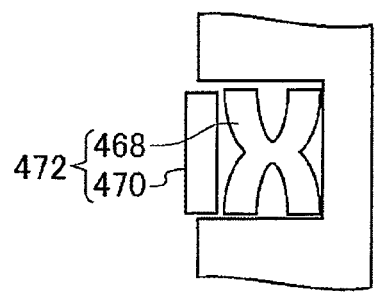
FIG. 17 explains a modification example of a sealing member.

An embodiment a part of which is altered from the aforementioned embodiment is explained below. FIG. 16 and FIG. 17 show an example in which the sealing member is altered. For example, instead of a slipper seal, it is also possible to adopt a sealing member 372 including a plate ring 370 and a U-letter shaped lip packing 368, or a sealing member 472 including a plate ring 470 and an X-letter shaped lip packing 468. The plate ring 370 is provided outside the lip packing 368, 468. The plate ring 370 will move by sliding with respect to a different member. This sealing member 372 can be used instead of any of the lower slipper seal 172, the upper slipper seal 192, and the slipper seal 226.

In addition, it is possible to provide a pressure detecting sensor, being an example of a pressure detecting section, on the upper surface of the cylinder lid 120 of the first cylinder 150 being an example of a pressing section. Accordingly, the control section 18 can detect the pressed amount of the cylinder lid 120 at the lower edge of the male screw portion 206. Here, the pressed amount includes a pressure and a distance.

It is also possible to provide a first control valve for flowing a fluid in and out of one of the first upper hollow portion 216 or the first lower hollow portion 214 formed by the piston rod 202 and the first cylinder 150, and a second control valve for flowing a fluid in and out of the second hollow portion 176 formed by the second piston upper portion 180 and the second cylinder 146. The second hollow portion 176 may be larger than one of the first upper hollow portion 216 or the first lower hollow portion 214.

The control section 18 may release the second control valve when moving the lower top plate 72 by controlling the first control valve to move the piston rod 202. The control section 18 may release the first control valve when controlling the second control valve to move the second piston upper portion 180. The control section 18 may control the first control valve when moving the second piston upper portion 180 at a predetermined speed or above, and may control the second control valve when moving the second piston upper portion 180 below the predetermined speed.

It is also possible to provide a pressure sensor for detecting the pressure applied to either the pressing surface being an upper surface of the lower top plate 72 or the upper surface of the moving stage member 124. The control section 18 may control the second control valve when the pressure sensor has detected the pressure above a predetermined pressure. When providing a pressure sensor, it is possible to detect the distribution of the pressure exerted onto the upper surface of the lower top plate 72 using the pressure sensor, and control the flow in and out of the fluid to the first upper hollow portion 216 and the first lower hollow portion 214 so that the pressure at the central portion of the lower top plate 72 approaches closer to the pressure in the other regions based on the detected value. Accordingly, the second cylinder 146 can correct the pressing distribution on the upper surface generated due to the driving of the second cylinder 146. In such a case, the control may be performed based on the relation between the value of the pressure sensor and the inner pressure of the first upper hollow portion 216 and the first lower hollow portion 214 and the detected value of the inner pressure of the first upper hollow portion 216 and the first lower hollow portion 214. In addition when providing a pressure sensor, control may be performed so that the inner pressure of the first cylinder 150 approaches closer to the inner pressure within the second cylinder 146, by preparing the relation between the inner pressure within the second cylinder 146 and the inner pressure of the first cylinder 150 in advance, and by detecting the inner pressure within the second cylinder 146 and the inner pressure of the first cylinder 150 respectively. Furthermore, when providing a pressure sensor, it is also possible to detect when the upper surface of the upper substrate holder 94 has contacted the lower surface of the upper heating module 80 by the movement of the moving stage member 124 based on the value of the pressure sensor, and thereafter switch the control of the first cylinder 150 to the pressure control from the speed and position control. In such a case, the timing for switching the control may be when the upper surface of the upper substrate holder 94 has become close to the lower surface of the upper heating module 80.

It is also possible to further provide a third control valve, in the first cylinder 150, for flowing a fluid in and out of the other of the first upper hollow portion 216 or the first lower hollow portion 214 to be controlled cooperatively with the first control valve, the other of the first upper hollow portion 216 or the first lower hollow portion 214 being a third space. The second hollow portion 176 is preferably larger than the space corresponding to the first upper hollow portion 216 plus the first lower hollow portion 214.

The control section 18 controls at least the first control valve when moving the second piston upper portion 180, and controls at least the second control valve when joining together a plurality of semiconductor substrates. The predetermined position may be a position at which a pair of substrates 90 supported by the lower top plate 72 are sandwiched between the lower top plate 72 and the upper top plate 82. The predetermined position may be a position immediately before a position at which a pair of substrates supported by the lower top plate 72 is sandwiched by the upper top plate 82 and the lower top plate 72.

Figure 18:
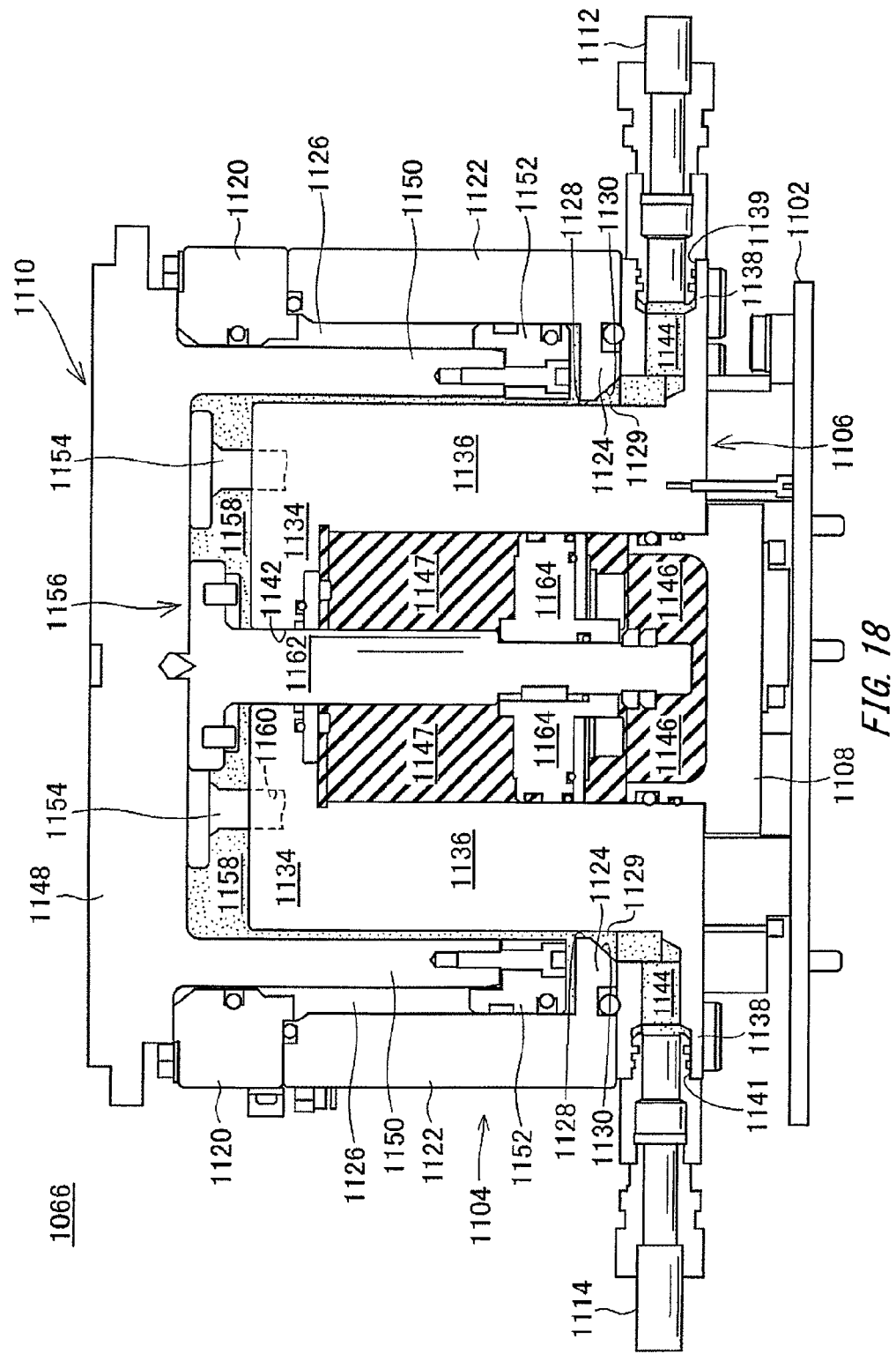
FIG. 18 is a longitudinal sectional view of an elevator section 1066.

FIG. 18 is a longitudinal sectional view of an elevator section 1066. As shown in FIG. 18, the elevator section 1066 includes base member 1102, an outer housing 1104, an inner housing 1106, a bottom member 1108, a movable section 1110, and a pair of flow tubes 1112, 1114. The outer housing 1104 and the inner housing 1106 are an example of a fixing section.

The base member 1102 is fixed to the floor or the like. The base member 1102 fixes the outer housing 1104, the inner housing 1106, the bottom member 1108, the movable section 1110, and the pair of flow tubes 1112, 1114, by directly or indirectly holding them.

The outer housing 1104 is provided to cover the outer perimeter of the elevator section 1066. The outer housing 1104 is fixed to the base member 1102. The outer housing 1104 includes an upper sealing member 1120, an outer wall 1122, and a lower annular section 1124.

The upper sealing member 1120 is formed as a ring. The upper sealing member 1120 is fixed to the upper edge of the outer wall 1122. The upper sealing member 1120 seals the upper side of the fluid pool 1126 formed inside the outer wall 1122.

The outer wall 1122 is formed as a cylinder hollow elongating vertically. The diameter of the outer wall 1122 is substantially the same as the diameter of the upper sealing member 1120.

The lower annular section 1124 is an example of the flow resistance member. The lower annular section 1124 is formed as a ring. The lower annular section 1124 protrudes from the inner surface at the lower side of the outer wall 1122 to inside. Between the inner surface of the lower annular section 1124 and the outer surface of the inner wall 1136 of the later described inner housing 1106, a ring-shaped resistance flow passage 1129 exerting resistance onto the fluid is formed. The upper edge of the resistance flow passage 1129 is provided with an opening 1128 linking the main hollow portion 1158 and the flow passage 1144 detailed below. The opening 1128 is formed on the inner surface of the lower annular section 1124 along its entire length. The opening 1128 is formed as a ring. The lower surface of the inner edge of the lower annular section 1124 is provided with a tapered surface 1130. The tapered surface 1130 tilts with respect to the vertical direction. The tapered surface 1130 is narrowed towards the upper direction. The resistance flow passage 1129 is formed from the upper edge of the opening 1128 through the lower edge of the tapered surface 1130.

The inner housing 1106 is fitted inside the outer housing 1104. The inner housing 1106 is fixed to the base member 1102. The inner housing 1106 includes an upper circular plate section 1134, an inner wall section 1136, and a lower outer periphery 1138.

The upper circular plate section 1134 is formed as a circular plate. The center of the upper circular plate section 1134 is provided with a shaft hole 1142. The shaft hole 1142 penetrates the upper circular plate section 1134 in the vertical direction.

The inner wall 1136 elongates from the lower surface of the outer perimeter of the upper circular plate section 1134 downwardly. The inner wall 1136 is integrally formed with the upper circular plate section 1134. The inner wall 1136 is formed as a cylinder hollow. The outer diameter of the inner wall 1136 is smaller than the inner diameter of the outer wall 1122. Accordingly, a space is formed between the inner wall 1136 and the outer wall 1122.

The lower outer periphery 1138 is formed along the entire outer perimeter of the inner wall 1136. In addition, the lower outer periphery 1138 is formed to be hollow, whose inner portion is opened. Accordingly, a flow passage 1144 is formed between the inner perimeter of the lower outer periphery 1138 and the inner wall 1136. The flow passage 1144 is formed along the entire periphery of the lower outer periphery 1138. Accordingly, the flow passage 1144 flows the fluid along its entire periphery. The entire periphery of the upper surface of the inner edge of the lower outer periphery 1138 is open. Accordingly, the flow passage 1144 of the lower outer periphery 1138 is linked to the opening 1128 between the inner surface of the lower annular section 1124 and the outer surface of the inner wall 1136 via the resistance passage 1129. A part of the outer perimeter of the lower outer periphery 1138 is provided with two flow inlets 1139, 1141 for flowing in and out a fluid from outside via flow tubes 1112, 1114. The lower flow inlet 1139 sandwiches the center of the upper circular plate section 1134 and is positioned opposite to the other lower flow inlet 1141. The flow inlets 1139, 1141 are formed as a column elongating in the horizontal direction. The outer edge of the flow inlets 1139, 1141 is open.

The bottom member 1108 is formed as a circular plate in a plan view. The bottom member 1108 closes the opening at the lower edge of the inner wall 1136 of the inner housing 1106. Accordingly, a lower sub hollow portion 1146 and an upper sub hollow portion 1147 are formed inside the bottom member 1108, the inner wall 1136, and the upper circular plate section 1134. A fluid for reciprocating the movable member 1110 flows in and out of the lower sub hollow portion 1146 and the upper sub hollow portion 1147.

The movable section 1110 is provided to be able to be moved back and forth in the vertical direction with respect to the outer housing 1104 and the inner housing 1106. The movable section 1110 includes a stage section 1148, a cylindrical leg 1150, a lower sealing member 1152, a plurality of guided sections 1154, and a piston section 1156.

The stage section 1148 is formed as a circular plate. The stage section 1148 covers the upper circular plate section 1134 of the inner housing 1106. A space is formed between the stage section 1148 and the upper circular plate section 1134.

The cylindrical leg 1150 elongates downward from the lower surface of the stage section 1148. The circular leg 1150 is fitted between the outer wall 1122 and the inner wall 1136. The inner diameter of the circular leg 1150 is larger than the outer diameter of the inner wall 1136. Accordingly, a space is formed between the inner wall 1136 and the outer wall 1122. As a result, the space between the upper circular plate section 1134 and the stage section 1148 is linked to the flow passage 1144 through the space between the inner wall 1136, the cylindrical leg 1150, and the lower annular section 1124, and via the resistance flow passage 1129. A main hollow portion 1158 in which the fluid to reciprocate the movable section 1110 flows in and out is formed between the cylindrical leg 1150 and the stage section 1148 of the movable section 1110, the upper circular plate section 1134 and the inner wall 1136 of the inner housing 1106, and the outer wall 1122 and the lower annular section 1124 of the outer housing 1104. The main hollow portion 1158 is an example of the space to which a fluid flows in and out. The main hollow portion 1158, the lower sub hollow portion 1146, and the upper sub hollow portion 1147 are insulated from one another. In other words, a fluid does not flow among the main hollow portion 1158, the lower sub hollow portion 1146, and the upper sub hollow portion 1147. Here, the capacity of the main hollow portion 1158 is larger than the capacity of the lower sub hollow portion 1146 and the upper sub hollow portion 1147. Therefore, when the movable section 1110 is moved at high speeds, mainly the fluid in the lower sub hollow portion 1146 and the upper sub hollow portion 1147 is controlled. On the other hand, when the movable section 1110 is operated at high pressures, mainly the fluid in the main hollow portion 1158 is controlled.

The outer diameter of the cylindrical leg 1150 is substantially the same as the inner diameter of the upper sealing member 1120. Accordingly, the outer peripheral surface of the cylindrical leg 1150 slidably contacts the inner peripheral surface of the upper sealing member 1120. The outer diameter of the cylindrical leg 1150 is smaller than the inner diameter of the outer wall 1122. Accordingly between the outer periphery of the cylindrical leg 1150 and the inner periphery of the outer wall 1122, a space serving as a fluid pool 1126 is formed. The upper portion of the fluid pool 1126 is sealed by the upper sealing member 1120.

The lower sealing member 1152 is fixed to the lower edge of the cylindrical leg 1150. The lower sealing member 1152 is formed as a ring. The outer diameter of the lower sealing member 1152 is substantially the same as the inner diameter of the outer wall 1122. Accordingly, the outer peripheral surface of the lower sealing member 1152 slidably contacts the inner peripheral surface of the outer wall 1122. In addition, the lower sealing member 1152 seals the main hollow portion 1158 enclosed by the upper circular plate section 1134, the inner wall 1136, the stage section 1148, and the cylindrical leg 1150. Accordingly, the lower sealing member 1152 restrains leak of the fluid contained in the main hollow portion 1158. Note that the fluid leaked through between the lower sealing member 1152 and the outer wall 1122 reaches the fluid pool 1126. Here, the fluid pool 1126 is sealed by the upper sealing member 1120. Therefore, the upper sealing member 1120 restrains the fluid leaked from the main hollow portion 1158 from leaking outside the elevator section 1066.

A guided section 1154 is fixed to the lower surface of the stage section 1148. The guided section 1154 is formed as a column elongating in the vertical direction. The guided section 1154 is slidably fit to the guide hole 1160 elongating in the vertical direction formed through the cylindrical leg 1150. The guided section 1154 is guided by the guide hole 1160 in the vertical direction.

The piston section 1156 includes a columnar section 1162 and a separating section 1164.

The columnar section 1162 is fixed to the center of the lower surface of the stage section 1148. The columnar section 1162 is formed as a column elongating in the vertical direction. The columnar section 1162 is slidably fit to the shaft hole 1142 of the upper circular plate section 1134. Sealing is provided between the columnar section 1162 and the shaft hole 1142. The lower edge of the columnar section 1162 reaches the lower sub hollow portion 1146 and the upper sub hollow portion 1147.

The separating section 1164 is fixed to the middle of the outer periphery of the columnar section 1162. The outer diameter of the separating section 1164 is substantially the same as the inner diameter of the cylindrical leg 1150. The separating section 1164 is provided to be slidable to the cylindrical leg 1150. In addition, the separating section 1164 separates the lower sub hollow portion 1146 and the upper sub hollow portion 1147 in the vertical direction. Accordingly, when a fluid is supplied to the lower sub hollow portion 1146, the separating section 1164 receives an upward pressing force from the fluid. As a result, the piston section 1156 moves upward together with the movable section 1110. On the other hand, when a fluid is supplied to the upper sub hollow portion 1147, the separating section 1164 receives a downward pressing force from the fluid. As a result, the piston section 1156 moves downward together with the movable section 1110. As a result, the movable section 1110 is moved back and forth with respect to the outer housing 1104 and the inner housing 1106.

A pair of flow tubes 1112, 1114 supply a fluid to the main hollow portion 1158 or exhausts a fluid from the main hollow portion 1158, via the flow passage 1144 and the opening 1128. The flow tubes 1112, 1114 are linked to the flow inlets 1139, 1141 formed on the lower outer periphery 1138.

Figure 19:
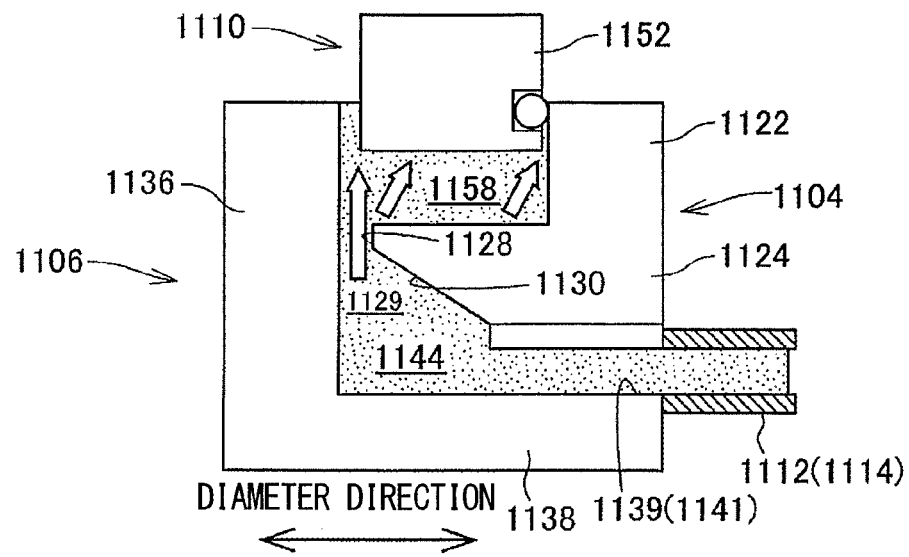
FIG. 19 is a longitudinal sectional view explaining an opening 1128 in the vicinity of the flow tube 1112.
Figure 20:
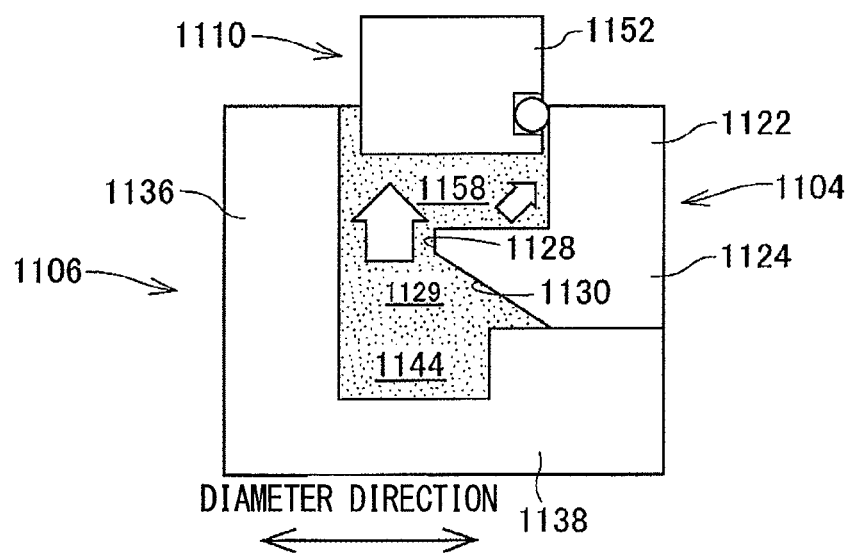
FIG. 20 is a longitudinal sectional view explaining an opening 1128 in a region distant from the flow tube 1112.
Figure 21:
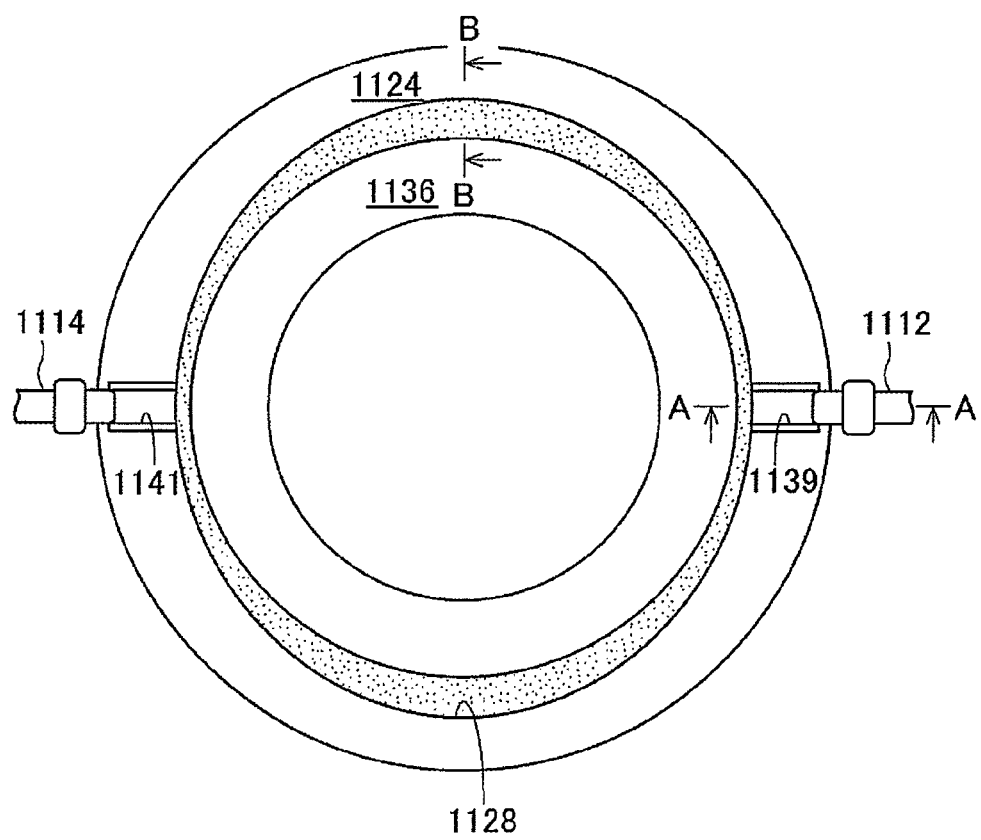
FIG. 21 is a schematic plan view explaining an opening 1128.

FIG. 19 is a longitudinal sectional view explaining an opening 1128 in the vicinity of the flow tube 1112. FIG. 20 is a longitudinal sectional view explaining an opening in a region distant from the flow tube 1112. FIG. 21 is a schematic plan view explaining an opening 1128. FIG. 19 is a longitudinal sectional view taken along the A-A line of FIG. 21. FIG. 20 is a longitudinal sectional view taken along the B-B line of FIG. 21.

As shown in FIG. 19 and FIG. 20, the lower annular section 1124 is provided between the main hollow portion 1158 and the flow inlets 1139, 1141. The resistance flow passage 1129 is formed between the inner peripheral surface of the lower annular section 1124 and the outer peripheral surface of the inner wall 1136. The resistance flow passage 1129 exerts the flow resistance which is a resistance to the fluid flowing through the main hollow portion 1158 from the fluid passage 1144 in which the fluid flowing from the fluid inlets 1139, 1141 runs. The width in the diameter direction of the opening 1128 in the vicinity of the fluid inlets 1139, 1141 is smaller than the width in the diameter direction of the opening 1128 away from the fluid inlets 1139, 1141. In addition as shown in FIG. 21, the width in the diameter direction of the opening 1128 gradually widens as distanced from the flow inlets 1139, 1141 along the flow passage 1144. Accordingly, the lower annular section 1124 serves as a flow rate control section that adjusts the flow rate of the fluid flowing in, to restrain the tilt of the movable section 1110. For example, the lower annular section 1124 equalizes the flow rate of the fluid per unit sectional area of the main hollow portion 1158 that is orthogonal to the reciprocation direction of the movable section 1110, to restrain the tilt of the movable section 1110.

Figure 22:
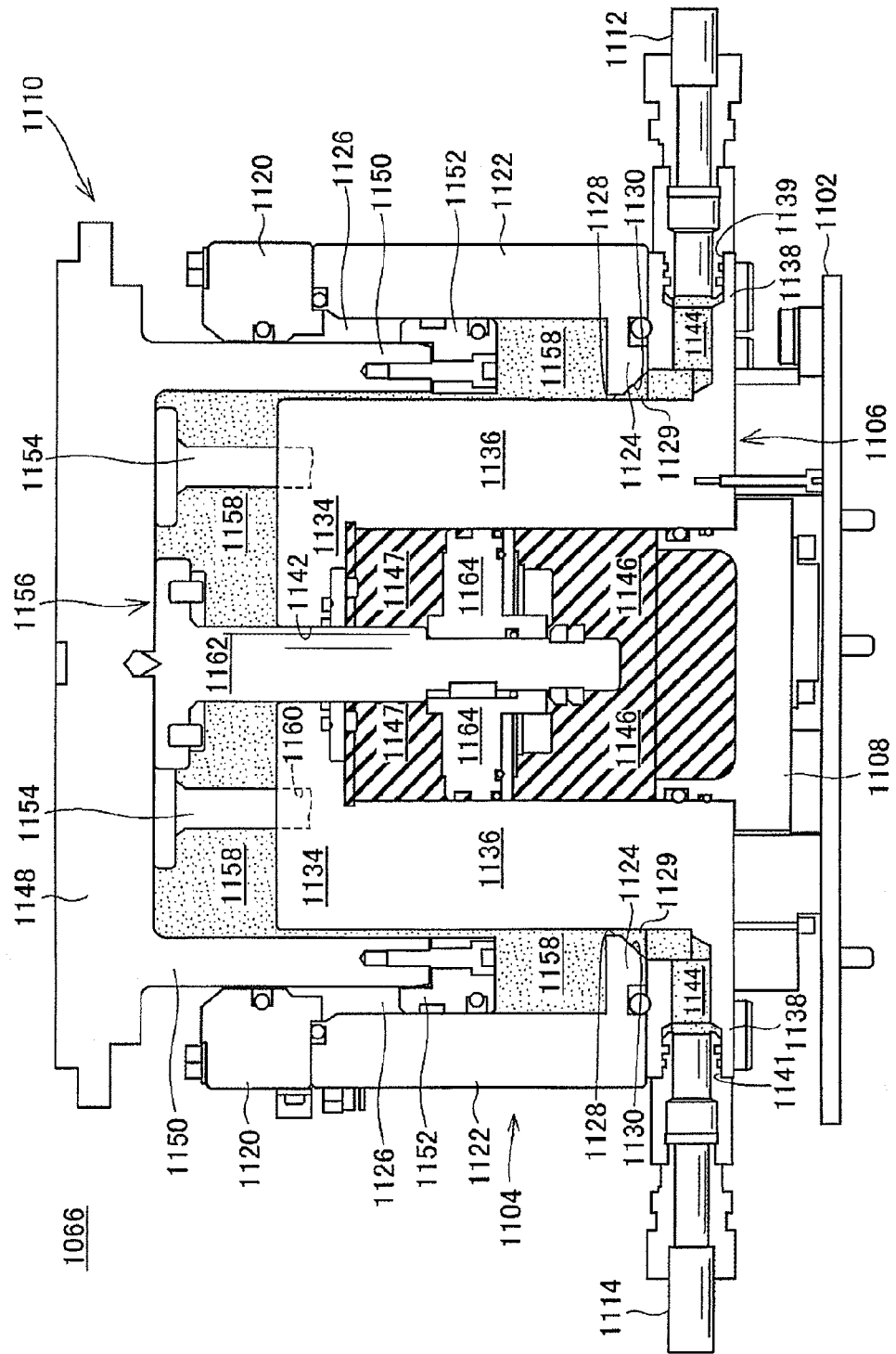
FIG. 22 is a diagram in which a movable section 1110 of an elevator section 1066 has moved in the upper direction.

FIG. 22 is a diagram in which the movable section 1110 of the elevator section 1066 has moved in the upper direction. The reciprocation movement of the movable section 1110 is explained with reference to FIG. 18 through FIG. 22.

First, in the state of FIG. 18, a fluid is supplied to the lower sub hollow portion 1146 having a capacity smaller than the capacity of the main hollow portion 1158, as well as the fluid in the upper sub hollow portion 1147 is exhausted. Accordingly, the separating section 1164 of the movable section 1110 receives an upward pressure from the fluid, to move the movable section 1110 in the upper direction as shown in FIG. 22. Due to this movement in the upper direction, the capacity of the main hollow portion 1158 increases. Therefore, the fluid is taken in from the fluid passage 1144 and the flow tubes 1112, 1114 via the opening 1128. Here, as shown in FIG. 19 through FIG. 21, the opening 1128 gradually increases in size as distanced from the flow inlets 1139, 1141. Accordingly, the opening 1128 in the vicinity of the flow inlets 1139, 1141 is larger in flow resistance to the fluid, than the opening 1128 distanced from the flow inlets 1139, 1141. In other words, the pressure loss of the fluid flowing through the opening 1128 in the vicinity of the flow inlets, 1139, 1141 is larger than the pressure loss of the fluid flowing through the opening 1128 distanced from the flow inlets 1139, 1141.

Therefore, in a region in the vicinity of the flow inlets 1139, 1141, the flow rate of the fluid flowing in the circumferential direction along the flow passage 1144 in a ring form is larger than the flow rate of the fluid flowing in the circumferential direction in a region distanced from the flow inlets 1139, 1141. Accordingly, in a region in the vicinity of the flow inlets 1139, 1141, the flow rate of the fluid taken in through the opening 1128 is equalized to the flow rate of the fluid taken in through the opening 1128 in a region distanced from the flow inlets 1139, 1141. As a result, the flow rate of the fluid per unit sectional area of the main hollow portion 1158 that is orthogonal to the vertical moving direction of the movable section 1110 is equalized, to equalize in the circumferential direction the pressure operating onto the bottom surface of the cylindrical leg 1150 from the fluid of the main hollow portion 1158. Accordingly, the stage section 1148 moves upward while keeping the horizontal state. Thereafter, when the pair of substrates 90 held by the lower top plate 72 contact the upper top plate 82, the main hollow portion 1158 having a large capacity is provided with the fluid, and the stage section 1148 presses the substrate 90 with a large pressing force via the lower top plate 72.

When moving the movable section 1110 downward, the fluid is supplied to the upper sub hollow portion 1147 as well as the fluid is exhausted from the lower sub hollow portion 1146. By the movement of the movable section 1110 downward, the fluid is exhausted from the main hollow portion 1158. Here, as described above, the opening 1128 is gradually widened as distanced from the flow inlets 1139, 1141. Therefore, the exhaustion of the fluid becomes substantially even in the circumferential direction of the flow passage. Accordingly, the stage section 1148 moves downward while keeping the horizontal state. In addition, even when there is a difference in flow rate between the flow inlet 1139 and the flow inlet 1141, the negative pressure difference caused between the flow passage 1144 in the vicinity of the flow inlet 1139 and the flow passage 1144 in the vicinity of the flow inlet 1141 can be decreased. Accordingly, the tilt of the movable section 1110 due to the difference in negative pressure, i.e., the difference in flow rate can be prevented.

As described above, in the elevator section 1066, the opening 1128 increases its size as distanced from the flow inlets 1139, 1141. Accordingly, the elevator section 1066 can equalize the flow rate of the fluid per unit sectional area of the main hollow portion 1158 that is orthogonal to the vertical moving direction of the movable section 1110. As a result, the elevator section 1066 can be moved back and forth in the vertical direction while keeping the stage section 1148 horizontal.

Figure 23:
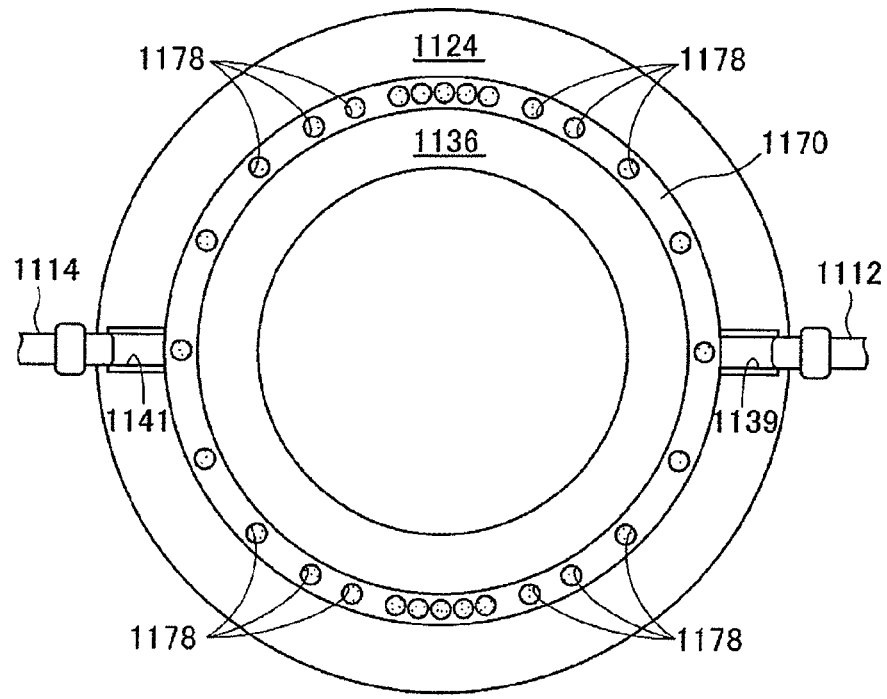
FIG. 23 is a schematic plan view explaining a modification embodiment of an opening.

FIG. 23 is a schematic plan view explaining a modification embodiment of an opening. In the embodiment shown in FIG. 23, a punched member 1170, being an example of a flow resistance member, is embedded between the lower annular section 1124 and the inner wall 1136. The entire outer periphery of the punched member 1170 contacts the inner periphery of the lower annular section 1124. The entire inner periphery of the punched member 1170 contacts the outer periphery of the inner wall 1136. Note that the punched member 1170 may be integrally formed with the lower annular section 1124 or the inner wall 1136. The punched member 1170 is formed as a ring plate. The punched member 1170 is provided with a plurality of openings 1178 in a circular formation. Each opening 1178 has the same opening area. The openings 1178 penetrate the punched member 1170 in the vertical direction. Accordingly, the openings 1178 link the flow passage 1144 to the main hollow portion 1158. The plurality of openings 1178 are insulated from each other. In other words, the openings 1178 are discontinuous to each other. Here, the number of the openings 1178 per unit area increases as distanced from the flow inlets 1139, 1141. In other words, the distance between the adjacent openings 1178 becomes smaller as distanced from the flow inlets 1139, 1141. Therefore, the opening area of the openings 1178 per unit area gets larger as distanced from the flow inlets 1139, 1141. Accordingly, the present embodiment can play an effect similar to that of the above-explained embodiment. Note that the opening area per unit area in the present embodiment is determined by the number of the openings 1178 while keeping the opening area of each opening 1178 constant. However, the opening area per unit area can also be determined by increasing the opening area of each opening 1178 as distanced from the flow inlets 1139, 1141.

Figure 24:
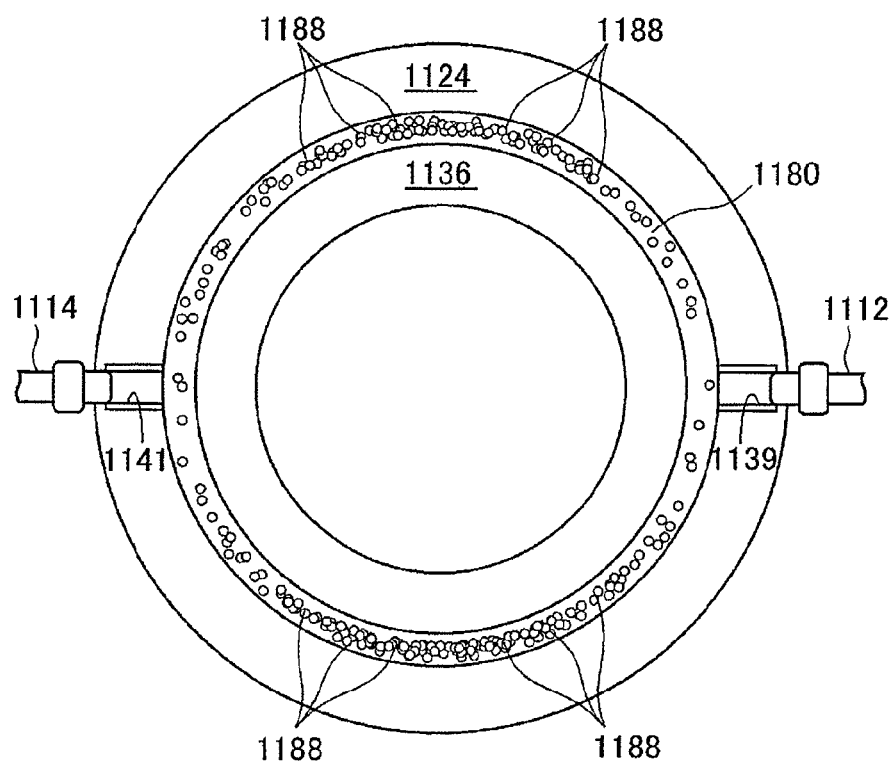
FIG. 24 is a schematic plan view explaining a modification embodiment of an opening.

FIG. 24 is a schematic plan view explaining a modification embodiment of an opening. In the embodiment shown in FIG. 24, a porous member 1180, being an example of a flow resistance member, is embedded between the lower annular section 1124 and the inner wall 1136. The entire outer periphery of the porous member 1180 contacts the inner periphery of the lower annular section 1124. The entire inner periphery of the porous member 1180 contacts the outer periphery of the inner wall 1136. Note that the porous member 1180 may be integrally formed with the lower annular section 1124 or the inner wall 1136. A plurality of link holes 1188 are provided through the porous member 1180. The porous member 1180 is penetrated in the vertical direction by the plurality of link holes 1188. Accordingly, the plurality of link holes 1188 link the flow passage 1144 to the main hollow portion 1158. Here, the density of the link holes 1188 is larger as distanced from the flow inlets 1139, 1141 along the flow passage 1144. Consequently, the present embodiment can also play an effect similar to that of the above-described embodiments.

Figure 25:
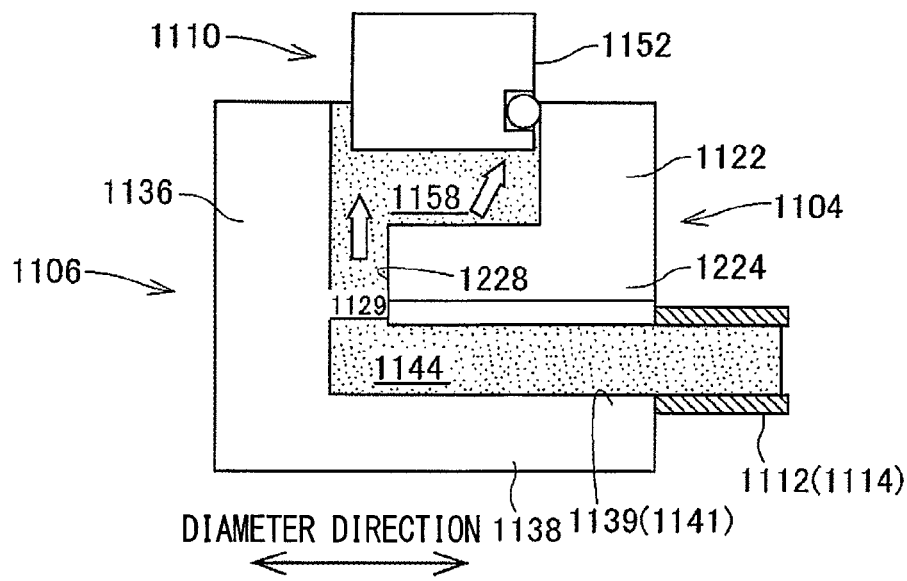
FIG. 25 is a longitudinal sectional view in the vicinity of the opening, which is used for explaining a modification embodiment of an opening.
Figure 26:
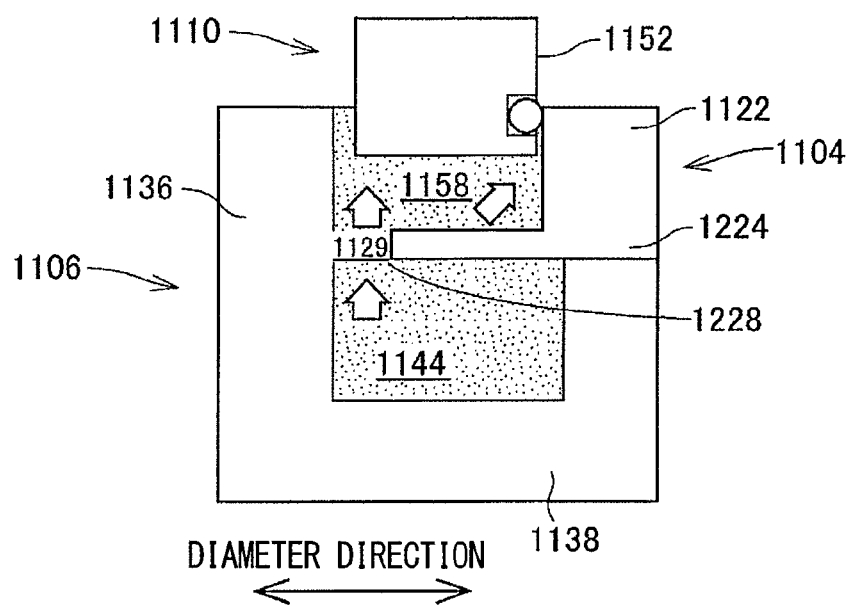
FIG. 26 is a longitudinal sectional view in the vicinity of the opening, which is used for explaining a modification embodiment of an opening.

FIG. 25 and FIG. 26 are each a longitudinal sectional view in the vicinity of the opening, which is used for explaining a modification embodiment of an opening. Note that FIG. 25 is a longitudinal sectional view of the same position as in FIG. 19, and FIG. 26 is a longitudinal sectional view of the same position as in FIG. 20.

As shown in FIG. 25 and FIG. 26, an opening 1228 is formed between the inner peripheral surface of the lower annular section 1124 and the outer peripheral surface of the inner wall 1136. The opening 1228 is continually formed along the entire outer periphery of the inner wall 1136. The opening 1228 is formed as a ring in the plan view. The inner periphery and the outer periphery of the opening 1228 are a precise circle, and are concentric. Therefore, the width in the diameter direction of the openings 1228 is constant along the entire periphery. In the moving direction of the movable section 1110, the thickness of the lower annular section 1224 parallel to the resistance flow passage 1129 gradually decreases as distanced from the flow inlets 1139, 1141 along the flow passage 1144. In other words, the length of the flow of the fluid flowing through the resistance passage 1129 gets gradually smaller as distanced from the flow inlets 1139, 1141 along the flow passage 1144. Accordingly, the length of the resistance passage 1129 formed by the opening 1228 gets gradually smaller as distanced from the flow inlets 1139, 1141. As a result, the resistance to the fluid gets smaller as distanced from the flow inlets 1139, 1141, and so the present embodiment can play an effect similar to that of the former explained embodiments. The thickness of the aforementioned punched member 1170 and the thickness of the porous member 1180 may also be set in the above manner.

Figure 27:
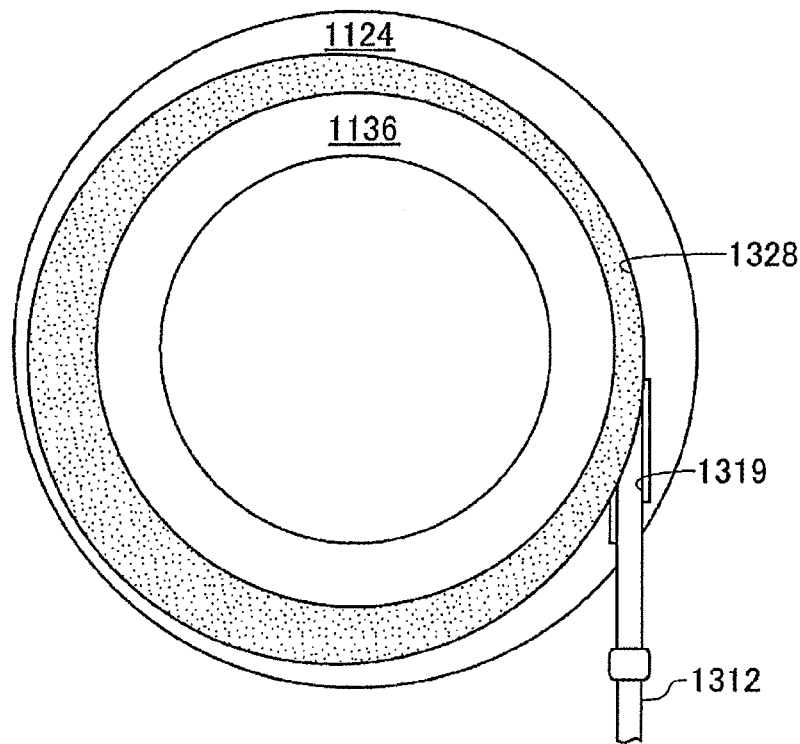
FIG. 27 is a schematic plan view explaining a modification example of an opening.

FIG. 27 is a schematic plan view explaining a modification example of an opening. In the embodiment shown in FIG. 27, the flow tubes 1312 are linked parallel to the direction in which the fluid flows in the flow inlet 1319. In this case, the opening 1328 has a width in diameter direction larger as distanced from the flow path 1144 of the fluid from the flow inlet 1319 through the middle portion, and a width in diameter smaller as distanced from the middle portion to the flow inlet 1319 along the flow passage 1144 of the fluid. Therefore, the width in diameter direction of the opening 1328 is the maximum at the middle portion. Accordingly, the present embodiment can play an effect similar to that of the above-explained embodiment.

Figure 28:
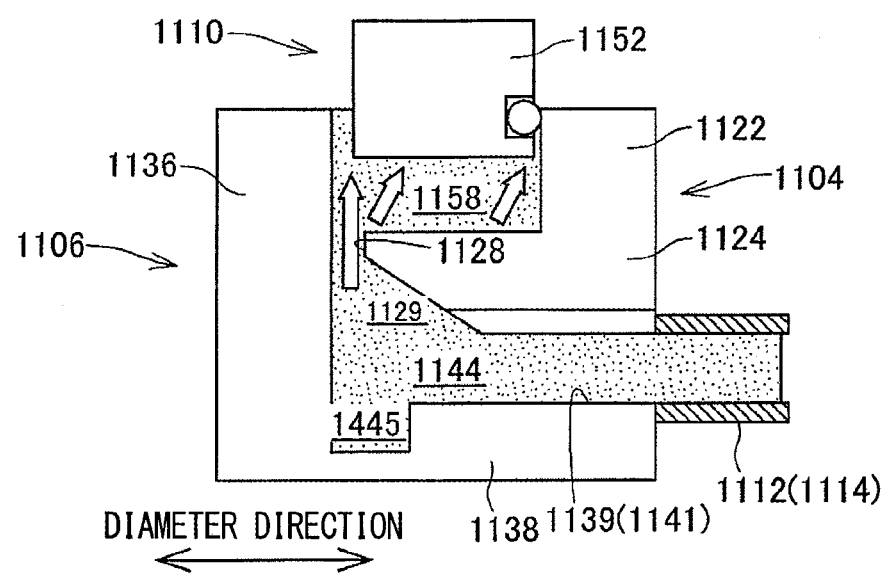
FIG. 28 is a longitudinal sectional view explaining an embodiment in which an auxiliary flow path is formed.
Figure 29:
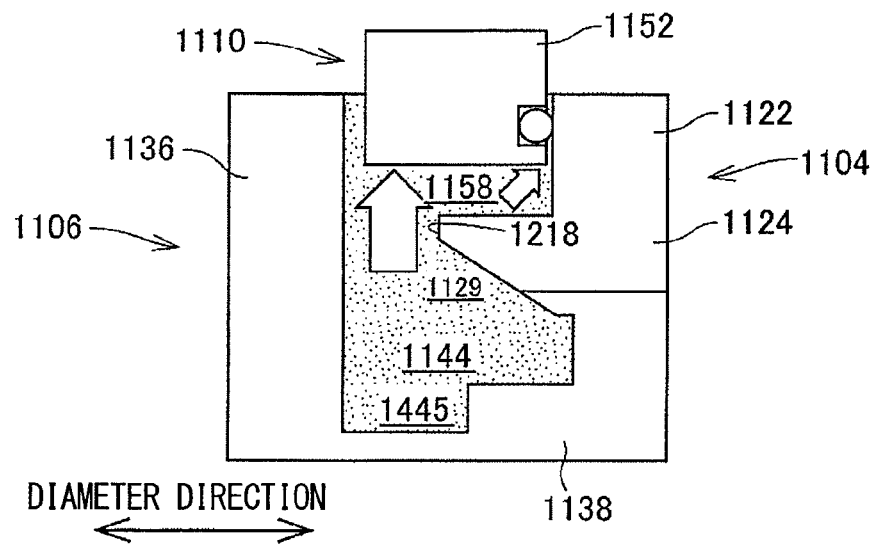
FIG. 29 is a longitudinal sectional view explaining an embodiment in which an auxiliary flow path is formed.

FIG. 28 and FIG. 29 each are a longitudinal sectional view explaining an embodiment in which an auxiliary flow path is formed. Note that FIG. 28 is a longitudinal sectional view of the same position as in FIG. 19, and FIG. 29 is a longitudinal sectional view of the same position as in FIG. 20. As shown in FIG. 28 and FIG. 29, the lower surface of the inner edge of the flow passage 1144 is provided with a groove 1445 which is an example of an auxiliary passage. The groove 1445 is provided to opposite to the main hollow portion 1158 sandwiching the flow passage 1144. The groove 1445 is formed to be linked to the flow passage 1144. The groove 1445 is formed as a ring concentric to the flow passage 1144. The groove 1445 is continually formed along the entire periphery of the flow passage 1144. The longitudinal sectional area of the groove 1445 gets smaller as distanced, in the vicinity of the flow inlets 1139, 1141. Note that the longitudinal sectional area of the groove 1445 mentioned here is a sectional area orthogonal to the circumferential direction. Accordingly, the flow resistance received by the fluid from the groove 1445 is smaller in the vicinity of the flow inlets 1139, 1141, and gets larger as distanced therefrom. Therefore, in the vicinity of the flow inlets 1139, 1141, the flux of the fluid in the circumferential direction is facilitated to prevent the flux in the vertical direction. On the other hand, the flux of the fluid in the circumferential direction is prevented as distanced from the flow inlets 1139, 1141, to play an effect of facilitating the flux in the vertical direction. As a result, the present embodiment can play an effect similar to that of the above-described embodiments. Note that the relation among the atmospheric pressure outside the elevator section 1066, the pressure in the opening 1128, the pressure exerted onto the movable section 1110, and the pressure in the groove 1445 may preferably be as follows:

the atmospheric pressure outside the elevator section 1066>>the pressure in the opening 1128>=the pressure exerted onto the movable section 1110>=the pressure in the groove 1445. Also in the present embodiment, the width in diameter direction of the opening 1128 is larger as distanced from the flow inlets 1139, 1141. However, the width in diameter direction of the opening 1128 may be constant regardless of its distance from the flow inlets 1139, 1141. In addition, the longitudinal sectional area of the groove 1445 may be constant regardless of its distance from the flow inlets 1139, 1141.

Figure 30:
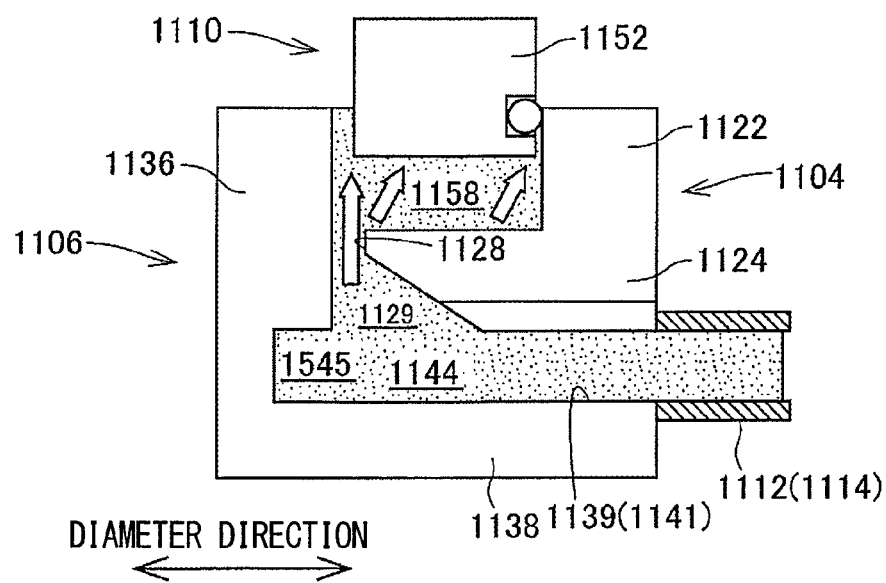
FIG. 30 is a longitudinal sectional view explaining a modification embodiment of an auxiliary flow path.

FIG. 30 is a longitudinal sectional view explaining a modification embodiment of an auxiliary flow path. In the embodiment shown in FIG. 30, the groove 1545, being an example of an auxiliary passage, is formed on the inner edge of the flow passage 1144. The groove 1545 is provided on the extension line of the flow direction of the flow flowing from the flow tubes 1112, 1114. The longitudinal sectional area of the groove 1545 may preferably be smaller as distanced from the flow inlets 1139, 1141, however, it may be constant.

Figure 31:
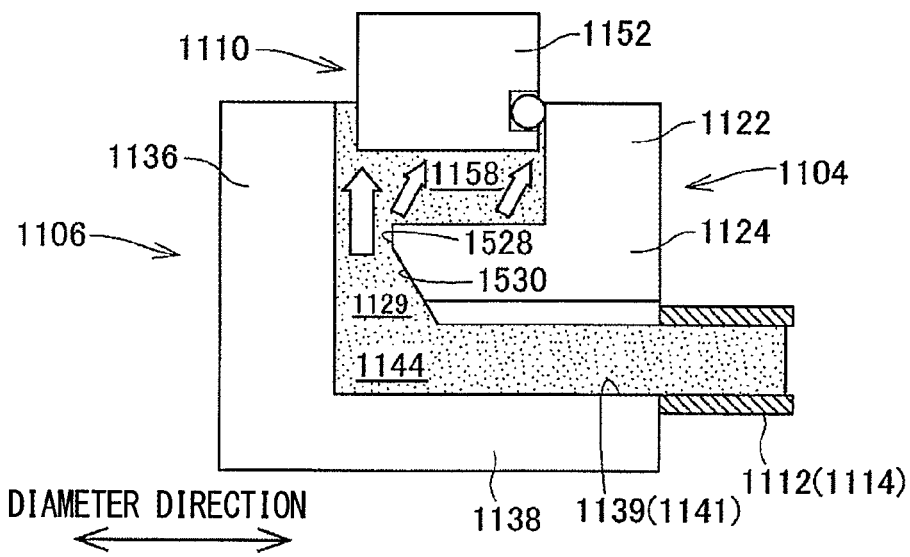
FIG. 31 is a longitudinal sectional view explaining a modification embodiment of a tapered surface.
Figure 32:
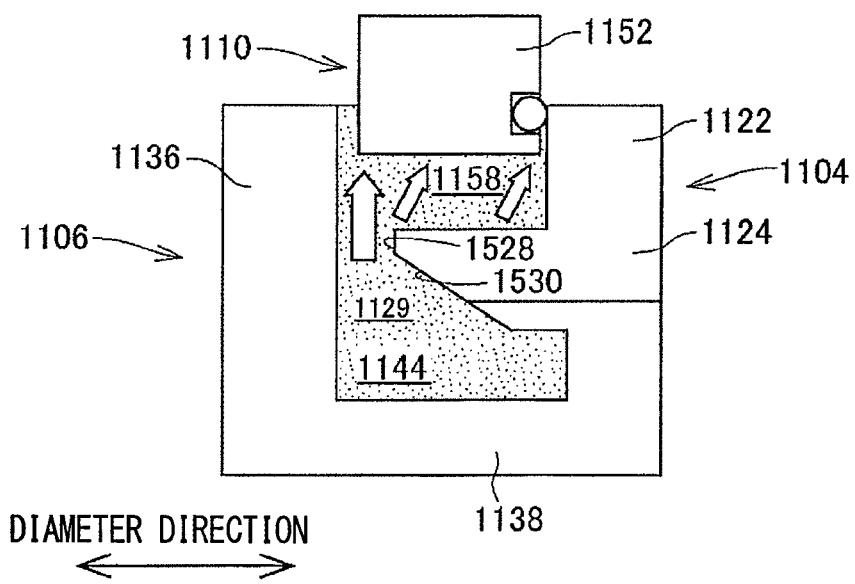
FIG. 32 is a longitudinal sectional view explaining a modification embodiment of a tapered surface.

FIG. 31 and FIG. 32 each are a longitudinal sectional view explaining a modification embodiment of the tapered surface. Note that FIG. 31 is a longitudinal sectional view of the same position as in FIG. 19, and FIG. 32 is a longitudinal sectional view of the same position as in FIG. 20. In the embodiments shown in FIG. 31 and FIG. 32, the lower annular section 1124 includes a ring-shaped tapered surface 1530 provided between the main hollow portion 1158 and the flow inlets 1139, 1141. The opening area of the tapered surface 1530 closer to the main hollow portion 1158 is smaller than the opening area of the tapered surface 1530 closer to the flow inlets 1139, 1141. The tilt of the tapered surface 1530 gets larger as distanced from the flow inlets 1139, 1141 along the flow passage 1144. Here, the tilt of the tapered surface 1530 means a tilt with respect to the vertical direction which is the moving direction of the movable section 1110. Accordingly, the flow resistance on the fluid from the tapered surface 1530 gets smaller as distanced from the flow inlets 1139, 1141. As a result, the present embodiment can play an effect similar to that of the former explained embodiments. Note that in the present embodiment, the width in diameter direction of the opening 1528 may be larger or constant as distant from the flow inlets 1139, 1141.

Figure 33:
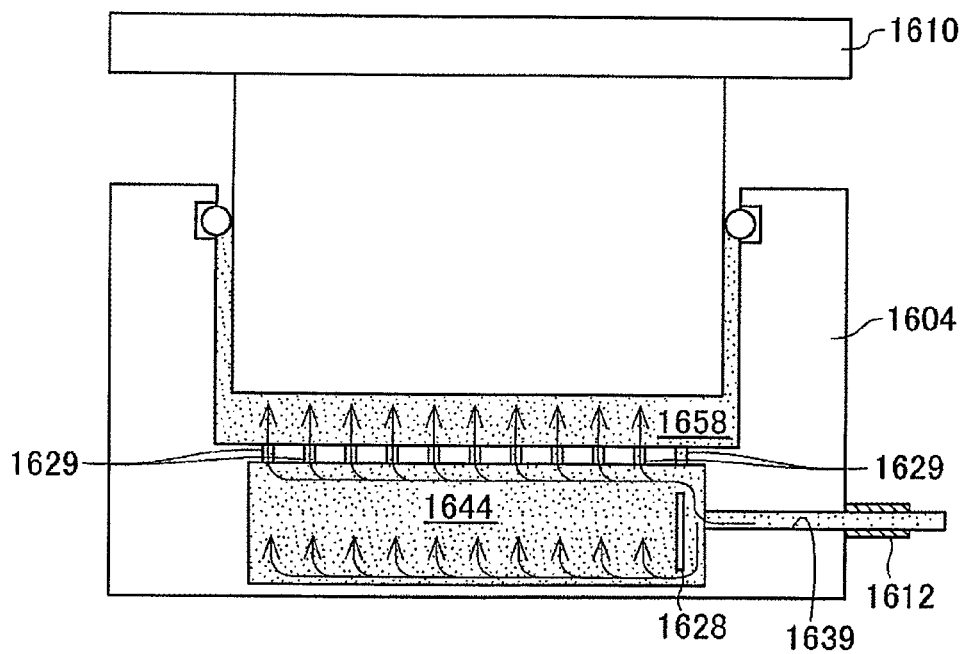
FIG. 33 is a schematic configuration diagram explaining another embodiment of an elevator section.

FIG. 33 is a schematic configuration diagram explaining another embodiment of an elevator section. The elevator section 1666 shown in FIG. 33 includes a housing 1604, being an example of a fixed section, a movable section 1610, a flow tube 1612, and a dispersing plate 1628 being an example of a dispersing member.

The top center of the housing 1604 is formed as a main hollow portion 1658. The main hollow portion 1658 is filled with a fluid to reciprocate the variable section 1610. The bottom of the housing 1604 is formed as a hollow portion which serves as a flow passage 1644 to flow and pool a fluid. An opening functioning as a flow inlet 1639 is provided through a part of the flow passage 1644. The flow passage 1644 is formed between the main hollow portion 1658 and the flow inlet 1639. The main hollow portion 1658 and the flow passage 1644 are linked by the plurality of link tubes 1629. The flow tube 1612 is connected to the outer edge of the flow inlet 1639.

The dispersing plate 1628 is provided on the extension line of the flow inlet 1639 towards the inside. The dispersing plate 1628 is provided at a distance from the edge of the flow inlet 1639. The plane area of the dispersing plate 1628 is larger than the flow inlet 1639 and smaller than the longitudinal sectional area of the flow passage 1644. Accordingly, a gap is formed between the dispersing plate 1628 and the inner surface of the flow passage 1644. Accordingly, the dispersing plate 1628 obstructs the fluid taken in from the flow inlet 1639 and the flowing fluid, to change the flow towards its outer periphery. Therefore, the dispersing plate 1628 makes the inside of the flow passage 1644 flow by dispersing the fluid in the flow passage 1644. Accordingly, the fluid is taken in or flowing into the main hollow portion 1658 substantially evenly in its sectional plane, via the link tube 1629. As a result, the elevator section 1066 can play an effect similar to that of the above-described embodiments.

Figure 34:
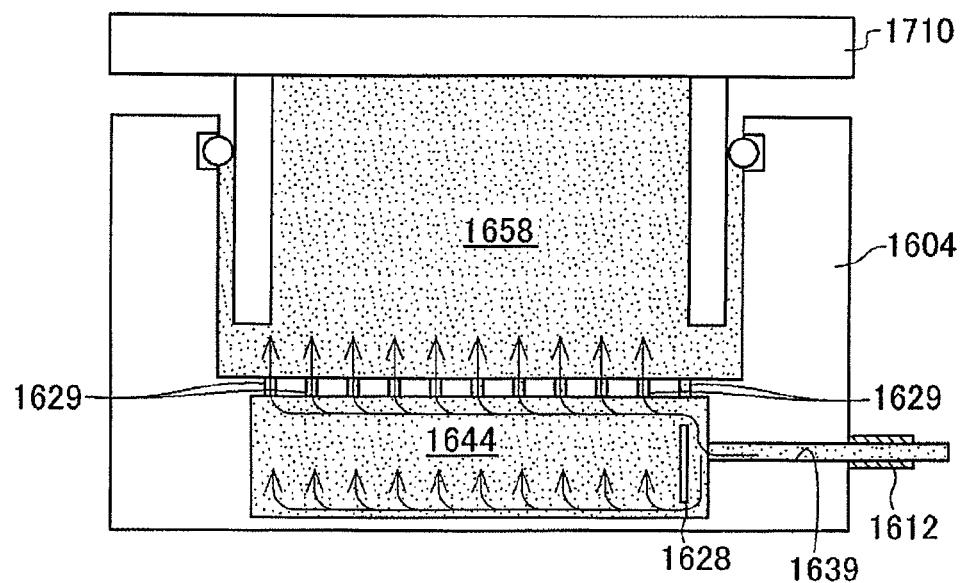
FIG. 34 is a schematic configuration diagram explaining another embodiment of an elevator section.

FIG. 34 is a schematic configuration diagram explaining another embodiment of an elevator section. The elevator section 1766 shown in FIG. 34 includes a movable section 1710 having a hollow portion formed below its central portion. Because of change in shape of the movable section 1710, the main hollow portion 1658 is larger than that of the embodiment shown in FIG. 33. The present embodiment can also play an effect similar to that of the above-described embodiments, by providing a dispersing plate 1628.

The following explains an embodiment, part of which is changed from the aforementioned embodiments. In each of the embodiments described above, the shape, number, and arrangement or the like of each configuration may be changed if necessary. It is also possible to combine the aforementioned embodiments.

For example, the number of input tubes may be 3 or more. The arrangement of the input tubes may preferably point asymmetric to the center of the flow passage regardless of the number of input tubes.

In the above-described embodiments, the opening 1128 does not change. However, it is possible to provide opening/closing section to open and close the opening 1128 using a motor or the like. The opening/closing section opens and closes the opening 1128 in response to the movement of the movable section 1110, to fluctuate the width in diameter direction and the opening area of the opening 1128. For example, since the faster the raising speed of the movable section 1110, the flow rate of the fluid can get greater, reduction in size of the opening 1128 can be proposed. An exemplary configuration of changing the opening 1128 is to configure the diameter of the lower annular section 1124 to be changeable.

In the above-described embodiments, the grooves 1445, 1545 do not change. However, the grooves 1445, 1545 can be changed. For example, the longitudinal sectional area of the groove 1445, 1545 can be changed in accordance with the speed of the movable section 1110.

The width in diameter direction of the opening 1128 is not particularly limited. In an example, the width in diameter direction of the opening 1128 set for flow rate control may preferably be larger than the tolerance which is an amount of deviation between the center of the main hollow portion 1158 and the center of the movable section 1110. By doing so, the eccentricity can be absorbed. The width in diameter direction of the opening 1128 may be set to correspond to the state in which the raising speed of the movable section 1110 is the greatest.

When the flow rate of the fluid that the flow tubes 1112, 1114 let in and out is different from each other, it is preferable to form openings and grooves according to the difference in flow rate. For example, a small opening or a small groove is preferred in the vicinity of the flow tubes having a greater flow rate. This applies to a case where there are three or more flow tubes, too.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE NUMERALS

10: substrate bonding apparatus, 12: environment chamber, 14: atmosphere environment section, 16: vacuum environment section, 18: control section, 20: substrate cassette, 22: substrate holder rack, 24: robot arm, 26: pre-aligner, 28: provisional bonding section, 30: robot arm, 34: frame, 36: fixed stage, 38: moving stage, 40: shutter, 42: shutter, 48: load lock chamber, 50: access door, 52: gate valve, 53: robot chamber, 54: robot arm, 55: container, 56: heating and pressing apparatus, 57: gate valve, 58: robot arm, 59: cooling chamber, 60: lower module, 62: upper module, 66: elevator section, 70: lower heating module, 72: lower top plate, 73: push-up pin, 80: upper heating module, 82: upper top plate, 90: substrate, 92: stacked substrate, 94: substrate holder, 116: outer housing, 118: inner housing, 120: cylinder lid, 122: second piston lower portion, 124: moving stage member, 126: upper sealing member, 128: driving force conveying section, 130: guide rod, 134: second hydraulic oil A port, 136: first hydraulic oil A port, 137: opening, 138: first hydraulic oil B port, 140: main exhaust section, 142: port, 146: second cylinder, 148: outer bottom, 150: first cylinder, 152: upper circular plate section, 154: lower annular plate section, 156: piston rod hole, 158: guide concave portion, 160: guide member, 162: guide hole, 164: bottom circular plate section, 166: standing ring section, 168: lower O-ring, 170: lower plate ring, 172: lower slipper seal, 174: concave portion, 176: second hollow portion, 178: second piston rod, 180: second piston upper portion, 182: second upper pressing surface, 188: upper O-ring, 190: upper plate ring, 192: upper slipper seal, 194: concave portion, 196: gas chamber, 198: auxiliary seal, 200: auxiliary concave portion, 202: piston rod, 204: first piston, 206: male screw portion, 208: nut, 210: steps, 212: hole, 214: first lower hollow portion, 216: first upper hollow portion, 218: first lower pressing surface, 220: first upper pressing surface, 222: O-ring, 224: seal ring, 226: slipper seal, 227: concave portion, 228: exhaust passage, 230: vent, 232: upper gas removal passage, 234: lower gas removal passage, 368: lip packing, 370: plate ring, 372: sealing member, 468: lip packing, 470: plate ring, 472: sealing member, 1066: elevator section, 1102: base member, 1104: outer housing, 1106: inner housing, 1108: bottom member, 1110: movable section, 1112: flow tube, 1114: flow tube, 1120: upper sealing member, 1122: outer wall, 1124: lower annular section, 1126: fluid pool, 1128: opening, 1129: resistance flow passage, 1130: tapered surface, 1134: upper circular plate section, 1136: inner wall, 1138: lower outer periphery, 1139: flow inlet, 1141: flow inlet, 1142: shaft hole, 1144: flow passage, 1146: lower sub hollow portion, 1147: upper sub hollow portion, 1148: stage section, 1150: cylindrical leg, 1152: lower sealing member, 1154: guided section, 1156: piston section, 1158: main hollow portion, 1160: guide hole, 1162: columnar section, 1164: separating section, 1170: punched member, 1178: opening, 1180: porous member, 1188: link hole, 1224: lower annular section, 1228: opening, 1312: flow tube, 1319: flow inlet, 1328: opening, 1445: groove, 1528: opening, 1530: tapered surface, 1545: groove, 1604: housing, 1610: movable section, 1612: flow tube, 1628: dispersing plate, 1629: link tube, 1639: flow inlet, 1644: flow passage, 1658: main hollow portion, 1666: elevator section, 1710: movable section, 1766: elevator section

What is claimed is:

1. A pressing apparatus for pressing a plurality of semiconductor substrates stacked on one another, comprising:
   a first stage that supports the plurality of substrates;
   a second stage that can sandwich the plurality of substrates between the first stage and the second stage;
   a driving section that moves the first stage towards the second stage in a moving direction so as to sandwich the plurality of substrates; and
   a pressing section that, when the driving section has made the first stage reach a predetermined position, applies a pressing force in the moving direction to the first stage to press the plurality of substrates between the first stage and the second stage, wherein
   the driving section and the pressing section are arranged next to each other so that at least part of the driving section and the pressing section overlaps in the moving direction.

2. The pressing apparatus according to claim 1, wherein at least part of the driving section is positioned inside the pressing section.

3. The pressing apparatus according to claim 1, comprising:
   a first pressing member linked to the first stage and pressing the first stage by a pressing force received from the driving section; and
   a second pressing member linked to the first stage and pressing the first stage by a pressing force received from the pressing section to press the plurality of substrates.

4. The pressing apparatus according to claim 3, comprising
   a control section that controls driving of the driving section, wherein
   at the time of pressing by the second pressing member, the control section controls a pressing force of the first pressing member, so that a pressure distribution of at least one of the first stage and the second stage is a predetermined distribution.

5. The pressing apparatus according to claim 3, further comprising:
   a guide rod linked to the first stage; and
   a guide member that guides the guide rod in line with the movement.

6. The pressing apparatus according to claim 5, wherein the guide rod is provided between the driving section and the pressing section.

7. The pressing apparatus according to claim 5, wherein a second pressing surface of the second pressing member pressed by the pressing section is closer to the stage than a position to which the guide member guides a plurality of guide rods.

8. The pressing apparatus according to claim 3, comprising
   a movable section including the first stage, wherein
   the first pressing member presses the center of mass of the movable section.

9. The pressing apparatus according to claim 3, wherein a second pressing surface of the second pressing member pressed by the pressing section is larger than a first pressing surface of the first pressing member pressed by the driving section.

10. The pressing apparatus according to claim 3, wherein a second pressing surface of the second pressing member pressed by the pressing section is closer to the first stage than a first pressing surface of the first pressing member pressed by the driving section.

11. The pressing apparatus according to claim 3, wherein the driving section includes a first cylinder into which the first pressing member is inserted and in which a fluid to apply a pressing force to the first pressing member flows,
the pressing section includes a second cylinder into which the second pressing member is inserted and in which a fluid to apply a pressing force to the second pressing member flows,
at least a part of the first cylinder is positioned inside the second cylinder, and
the second pressing member is pressed by a fluid flowing in a space between the first cylinder and the second cylinder.

12. The pressing apparatus according to claim 3, comprising:
a mounting section positioned between the first stage and the second stage, on which the plurality of substrates are mounted; and
a control section that controls driving of the driving section, wherein
the control section controls a speed of the first stage to be decreased when the first stage removes the plurality of substrates mounted on the mounting section, from the mounting section.

13. The pressing apparatus according to claim 12, wherein the control section controls the speed of the first stage to be decreased prior to sandwiching, between the first stage and the second stage, the plurality of substrates supported by the first stage.

14. The pressing apparatus according to claim 3, wherein the pressing force applied by the second pressing member to the first stage is larger than a pressing force applied by the first pressing member to the first stage.

15. The pressing apparatus according to claim 11, comprising:
a first control valve that causes a fluid to flow in and out of a first space formed by the first cylinder and the first pressing member; and
a second control valve that causes a fluid to flow in and out of a second space formed by the second cylinder and the second pressing member.

16. The pressing apparatus according to claim 15, wherein the second space is larger than the first space.

17. The pressing apparatus according to claim 15, wherein the second control valve is opened when moving the first stage by controlling the first control valve to move the first pressing member.

18. The pressing apparatus according to claim 15, wherein the first control valve is opened when controlling the second control valve to move the second pressing member.

19. The pressing apparatus according to claim 15, wherein the first control valve is controlled when moving move the second pressing member at a predetermined speed or above, and
the second control valve is controlled when moving the second pressing member at a lower speed than the predetermined speed.

20. The pressing apparatus according to claim 15, wherein a third space different from the first space is formed in the first cylinder, and
the pressing apparatus further comprising a third control valve cooperatively controlled together with the first control valve for causing a fluid to flow in and out of the third space.

21. The pressing apparatus according to claim 20, wherein the second space is larger than a space corresponding to the first space plus the third space.

22. The pressing apparatus according to claim 15, wherein at least the first control valve is controlled when moving the second pressing member, and
at least the second control valve is controlled when pressing the plurality of substrates.

23. The pressing apparatus according to claim 1, wherein the predetermined position is a position at which the plurality of substrates supported by the first stage are sandwiched between the first stage and the second stage.

24. The pressing apparatus according to claim 1, wherein the predetermined position is a position immediately before a position at which the plurality of substrates supported by the first stage are sandwiched by the second stage.

25. A pressing apparatus for pressing a plurality of semiconductor substrates stacked on one another, comprising:
a first stage that supports the plurality of substrates;
a second stage that can sandwich the plurality of substrates between the first stage and the second stage;
a driving section that moves the first stage towards the second stage in a moving direction so as to sandwich the plurality of substrates;
a pressing section that, when the driving section has made the first stage reach a predetermined position, applies a pressing force in the moving direction to the first stage to press the plurality of substrates between the first stage and the second stage; and
a control section that controls driving of the driving section, wherein
the control section controls a pressing force exerted on the first stage from the driving section, so that a pressure distribution of at least one of the first stage and the second stage is a predetermined distribution at the time of pressing by the pressing section.

26. A pressing apparatus for pressing a plurality of semiconductor substrates stacked on one another, comprising:
a movable section that includes a first stage supporting the plurality of substrates;
a second stage that can sandwich the plurality of substrates between the first stage and the second stage;
a driving section that moves the first stage towards the second stage in a moving direction so as to sandwich the plurality of substrates;
a pressing section that, when the driving section has made the first stage reach a predetermined position, applies a pressing force in the moving direction to the first stage to press the plurality of substrates between the first stage and the second stage; and
a pressing member linked to the first stage and pressing the first stage by a pressing force received from the driving section, wherein
the pressing member presses the center of mass of the movable section.

27. A substrate bonding apparatus comprising:
an aligning section that aligns the plurality of substrates with one another; and
the pressing apparatus as set forth in claim 1 for pressing to one another the plurality of substrates whose positions have been aligned.

28. A pressing apparatus comprising:
a fixed section;
a movable section capable of being moved back and forth with respect to the fixed section, a space to which a fluid flows in and out being formed between the movable section and the fixed section; and
a tilt restraining section that restrains a tilt of the movable section due to entry of the fluid.

29. The pressing apparatus according to claim 1, further comprising:
a first pressing member linked to the first stage and pressing the first stage by a pressing force received from the driving section; and
a second pressing member linked to the first stage and pressing the first stage by a pressing force received from the pressing section to press the plurality of substrates; wherein
at least part of the driving section is positioned inside the pressing section,
the driving section includes a first cylinder into which the first pressing member is inserted and in which a fluid to apply a pressing force to the first pressing member flows,
the pressing section includes a second cylinder into which the second pressing member is inserted and in which a fluid to apply a pressing force to the second pressing member flows,
at least a part of the first cylinder is positioned inside the second cylinder, and
the second pressing member is pressed by a fluid flowing in a space between the first cylinder and the second cylinder.

* * * * *